United States Patent
Osako et al.

(10) Patent No.: US 9,644,048 B2
(45) Date of Patent: May 9, 2017

(54) COMPOSITION FOR ANODE BUFFER LAYER, HIGH-MOLECULAR WEIGHT COMPOUND FOR ANODE BUFFER LAYER, ORGANIC ELECTROLUMINESCENCE ELEMENT, AND PRODUCTION PROCESS AND USES OF THE SAME

(75) Inventors: Haruka Osako, Chiba (JP); Nobuhiro Natori, Chiba (JP); Tsuyoshi Katoh, Chiba (JP); Kunio Kondo, Chiba (JP); Yosuke Fukuchi, Chiba (JP)

(73) Assignee: SAMSUNG ELECTRONICS CO., LTD, Gyeonggi-Do (KR)

(*) Notice: Subject to any disclaimer, the term of this patent is extended or adjusted under 35 U.S.C. 154(b) by 860 days.

(21) Appl. No.: 13/504,076

(22) PCT Filed: Oct. 27, 2010

(86) PCT No.: PCT/JP2010/069037
§ 371 (c)(1),
(2), (4) Date: Apr. 25, 2012

(87) PCT Pub. No.: WO2011/052625
PCT Pub. Date: May 5, 2011

(65) Prior Publication Data
US 2012/0217491 A1    Aug. 30, 2012

(30) Foreign Application Priority Data

Oct. 27, 2009   (JP) ................................ 2009-246445
Feb. 5, 2010    (JP) ................................ 2010-024417

(51) Int. Cl.
*C08F 12/32*    (2006.01)
*C08F 12/14*    (2006.01)
(Continued)

(52) U.S. Cl.
CPC .............. *C08F 12/32* (2013.01); *C08F 12/14* (2013.01); *C08F 12/26* (2013.01); *C08F 20/34* (2013.01);
(Continued)

(58) Field of Classification Search
None
See application file for complete search history.

(56) References Cited

U.S. PATENT DOCUMENTS 6,066,712 A    5/2000   Ueda et al.
7,166,010 B2   1/2007   Lamansky et al.
(Continued)

FOREIGN PATENT DOCUMENTS

CN    1874626 A    12/2006
JP    8-157575 A    6/1996
(Continued)

OTHER PUBLICATIONS

NCBI PubChem Substance, F4TCNQ—Substance Summary, http://pubchem.ncbi.nlm.nih.gov/summary/summary.cgi?sid=248634638wiewopt=Deposited, printed Mar. 14, 2012, 2 pages.
(Continued)

*Primary Examiner* — Anthony J Frost
(74) *Attorney, Agent, or Firm* — Cantor Colburn LLP

(57) ABSTRACT

There is provided a material for an anode buffer lay which permits the use of an organic solvent as a solvent an anode buffer layer-forming solution, and is capable forming an anode buffer layer that does not dissolve even win coated with a luminescent layer-forming material solution containing an organic solvent as a solvent, and which is capable of producing an organic EL element having high electrical power efficiency and long life.

11 Claims, 1 Drawing Sheet

(51) Int. Cl.
  *C08F 12/26* (2006.01)
  *C08F 20/34* (2006.01)
  *C09D 125/18* (2006.01)
  *H01L 51/00* (2006.01)
  *H05B 33/10* (2006.01)
  *H01L 51/50* (2006.01)

(52) U.S. Cl.
  CPC .......... *C09D 125/18* (2013.01); *H01L 51/004* (2013.01); *H05B 33/10* (2013.01); *B32B 2457/202* (2013.01); *H01L 51/5088* (2013.01)

(56) References Cited

U.S. PATENT DOCUMENTS

| | | | |
|---|---|---|---|
| 7,250,226 | B2 | 7/2007 | Tokito et al. |
| 7,510,782 | B2 | 3/2009 | Kato et al. |
| 7,582,363 | B2 | 9/2009 | Takahashi et al. |
| 7,687,986 | B2 | 3/2010 | Nakayama |
| 2006/0192497 | A1* | 8/2006 | Hara et al. .................. 315/169.3 |
| 2007/0155928 | A1 | 7/2007 | Koyama et al. |
| 2007/0292715 | A1* | 12/2007 | Yoon .................... C07D 221/20 428/690 |

FOREIGN PATENT DOCUMENTS

| | | | |
|---|---|---|---|
| JP | 10-1665 | A | 1/1998 |
| JP | 10-310606 | A | 11/1998 |
| JP | 2000-36390 | A | 2/2000 |
| JP | 2001-223084 | A | 8/2001 |
| JP | 2002-252085 | A | 9/2002 |
| JP | 2003-113246 | A | 4/2003 |
| JP | 2003-119179 | A | 4/2003 |
| JP | 2003-147021 | A | 5/2003 |
| JP | 2003-171391 | A | 6/2003 |
| JP | 2003-206320 | A | 7/2003 |
| JP | 2003-342325 | A | 12/2003 |
| JP | 2004-346312 | A | 12/2004 |
| JP | 2005-97589 | A | 4/2005 |
| JP | 2005-200638 | A | 7/2005 |
| JP | 2007-42729 | A | 2/2007 |
| JP | 2007042729 | A * | 2/2007 |
| JP | 2007-197587 | A | 8/2007 |
| WO | 03001616 | A2 | 1/2003 |
| WO | 2009/102027 | A1 | 8/2009 |
| WO | 2009/116414 | A1 | 9/2009 |
| WO | 2010016512 | A1 | 2/2010 |

OTHER PUBLICATIONS

Catalog of Series 2400 SourceMeter Line, manufactured by Keithley Instruments Inc., 8 pages.

Ohmori, Yutaka, Recent Development of Highly Efficient Organic EL Materials, Oyo Buturi, vol. 70, No. 12, (2001), pp. 1419-1425.

C.W. Tang, et al.; "Organic Electroluminescent Diodes"; Appl. Phys. Lett.; vol. 51, No. 12; Sep. 21, 1987; pp. 913-915.

Shunro Yamaguchi, et al.; "Preparation of 7,7,8,8-Tetracyanoquinodimethane and its Derivatives"; Chemistry Letters; vol. 14, No. 6; 1985; pp. 689-690.

T. Uchida, et al.; "Dictionary of Flat Panel Display Technology", 2001; pp. 423-426.

Suzuki Mitsunori et al., "Highly efficient polymer light-emitting devices using ambipolar phosphorescent polymers:", Applied Physics Letters, American Institute of Physics, US, vol. 86, No. 10, Mar. 3, 2005, pp. 103507-1-103507.

Communication dated Jun. 27, 2014 from the European Patent Office in counterpart European Patent Application No. 10826757.6.

Suzuki Mitsunori et al., Highly efficient 1-12 polymer light-emitting devices using ambipolar phosphorescent polymers:, Applied Physics Letters, American Institute of Physics, US, vol. 86, No. 10, Mar. 3, 2005, pp. 103507-1-103507-3.

* cited by examiner

US 9,644,048 B2

COMPOSITION FOR ANODE BUFFER LAYER, HIGH-MOLECULAR WEIGHT COMPOUND FOR ANODE BUFFER LAYER, ORGANIC ELECTROLUMINESCENCE ELEMENT, AND PRODUCTION PROCESS AND USES OF THE SAME

CROSS REFERENCE TO RELATED APPLICATIONS

This application is a National Stage of International Application No. PCT/JP2010/069037, filed on Oct. 27, 2010, which claims priority from Japanese Patent Application Nos. 2009-246445, filed on Oct. 27, 2009 and 2010-024417 filed on Feb. 5, 2010, the contents of all of which are incorporated herein by reference in their entirety.

TECHNICAL FIELD

The present invention relates to a material for an anode buffer layer constituting an organic electroluminescence (hereinafter, also referred to as an "organic EL") element, an organic EL element using the same, and a production method and uses of the same. In more detail, the present invention relates to a composition for an anode buffer layer comprising a particular polymer host material, or a high-molecular weight compound for an anode buffer layer comprising a particular structural unit, and an organic EL element or the like using the same.

BACKGROUND ART

Since C. W. Tang et al. of Eastman Kodak Company invented organic EL elements achieving high luminance (Appl. Phys. Lett., Vol. 51, page 913, 1987) in 1987, there have been rapid progresses in the development of materials for the organic EL elements and in the improvement in element structures. Practical uses of the organic EL elements have started recently in, e.g., displays of car audio systems and cellular phones. In order to further expand the uses of the organic EL (electroluminescence), the development of materials that provide improved luminous efficiency and durability and the development of full color displays, etc. are currently underway in earnest.

The organic EL element requires a pair of electrodes and a luminescent layer held by these. Between an anode and the luminescent layer, an anode buffer layer (also called a hole injection layer or the like) is optionally further provided adjacently to the anode, for the purposes of, e.g., decreasing the voltage to drive the organic EL element, enhancing the current efficiency, stabilizing the hole injection to enhance the electrical power efficiency ($\propto$luminous efficiency/driving voltage) of the organic EL element in order for the organic EL element to have a longer life, and coating a projection of the anode and the like to decrease a defect of the element.

As a material for the anode buffer layer, there can be mentioned, for example, a polymer material and an oligomer material, and various materials have been known.

As the polymer material, for example, polyaniline, polythiophene (e.g., polyethylene dioxythiophene (PEDOT)), and a material that is made conductive by mixing an oxidant into a polymer having arylamine as a main chain or a side chain are known (Non-Patent document 1).

For example, Patent document 1 (JP-A-2000-36390), Patent document 2 (JP-A-2001-223084) and Patent document 3 (JP-A-2002-252085) each describe a hole injection layer comprising an electron-accepting compound (an oxidant) and a polymer that has a specific arylamine structure. A method for forming the hole injection layer is described therein as including the steps of preparing a coating solution containing the electron-accepting compound and the polymer that has a specific arylamine structure, coating an anode with the coating solution by means such as spin coating and dip coating, and drying the solution.

CITATION LIST

Patent Document

Patent Document 1: JP-A-2000-36390
Patent Document 2: JP-A-2001-223084
Patent Document 3: JP-A-2002-252085

Non-Patent Document

Non-Patent Document 1: "Dictionary of Flat Panel Display Technology", supervised by Tatsuo UCHIDA and Heiju UCHIIKE, First Edition, Kogyo Chosakai Publishing Co., Ltd., 2001, pages 423-426

SUMMARY OF THE INVENTION

Problem to be Solved by the Invention

However, when using a polymer material solution containing an organic solvent as a solvent to form an anode buffer layer, applying thereon a solution of a luminescent layer-forming material or the like to form a luminescent layer sometimes resulted in the anode buffer layer being dissolved by the solvent (organic solvent) during the formation of the luminescent layer or the like.

Such a problem is in no way suggested in any of the Patent documents 1 to 3, which disclose the technique of forming the luminescent layer or the like on the anode buffer layer (hole injection layer) by deposition method.

On the other hand, when using an aqueous solution of a polymer material to form the anode buffer layer, the above problem does not occur. However, while the polymer material, often having an ionic group and the like, can improve electrical power efficiency, the ion dispersion or the like caused when the organic EL is driven frequently promoted the deterioration of the organic EL element.

It is an object of the present invention to solve such a problem as described above in the conventional art, and to provide a material for an anode buffer layer which permits the use of an organic solvent as a solvent of an anode buffer layer-forming solution, and is capable of forming an anode buffer layer that does not dissolve even when coated with a luminescent layer-forming material solution containing an organic solvent as a solvent, and which is capable of producing an organic EL element having high electrical power efficiency and long life.

Means for Solving the Problem

The invention relates to, for example, the following [1] to [10].

[1] A composition for an anode buffer layer comprising:
an electron-accepting compound, and
a high-molecular weight compound having a structural unit represented by the following formula (1) or the following formula (2) and having a weight average molecular weight of 20,000 to 1,000,000 as measured by GPC:

(1)

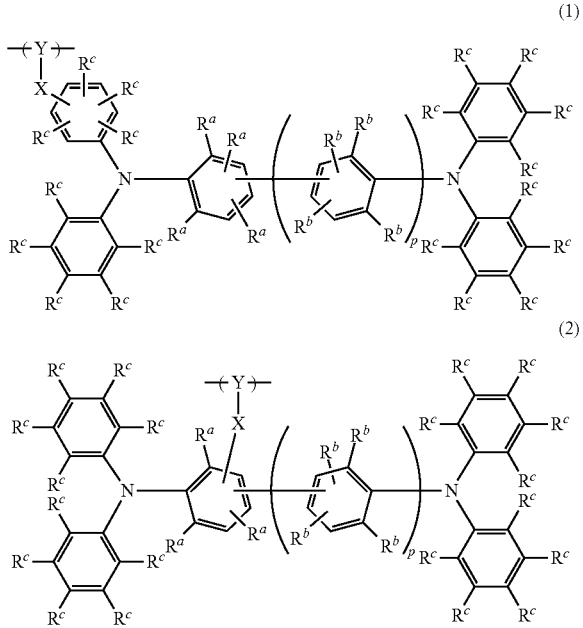

(2)

wherein in each of the formulae (1) and (2);

plural $R^a$s are each independently a hydrogen atom or an alkyl group having 1 to 10 carbon atoms, with at least one $R^a$ being the alkyl group having 1 to 10 carbon atoms;

plural $R^b$s are each independently a hydrogen atom or an alkyl group having 1 to 10 carbon atoms;

plural $R^c$s are each independently a hydrogen atom, a halogen atom, a cyano group, an amino group, an alkyl group having 1 to 10 carbon atoms, or an alkoxy group having 1 to 10 carbon atoms, and $R^c$s each bonded to neighboring carbon atoms in the same phenyl group may be bonded to one another to form a condensed ring;

X is a single bond, —O—, —S—, —SO—, —SO$_2$—, —NR$^1$— (wherein R$^1$ is a hydrogen atom, an alkyl group having 1 to 4 carbon atoms, or a phenyl group), —CO—, —COO—, or a divalent organic group having 1 to 20 carbon atoms (wherein the organic group may contain an atom or a group selected from the group consisting of —O—, —S—, —SO—, —SO$_2$—, —NR$^2$— (wherein R$^2$ is a hydrogen atom, an alkyl group having 1 to 4 carbon atoms, or a phenyl group), —CO— and —COO—.);

Y—X— is a group represented by:

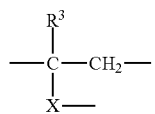

(wherein R$^3$ is a hydrogen atom or an alkyl group having 1 to 4 carbon atoms); and p is 0, 1, or 2.

[2] A high-molecular weight compound for an anode buffer layer comprising:

a structural unit represented by the following formula (1) or the following formula (2), and a structural unit derived from an electron-accepting compound having a polymerizable functional group, the said high-molecular weight compound for an anode buffer layer having a weight average molecular weight of 20,000 to 1,000,000 as measured by GPC:

(1)

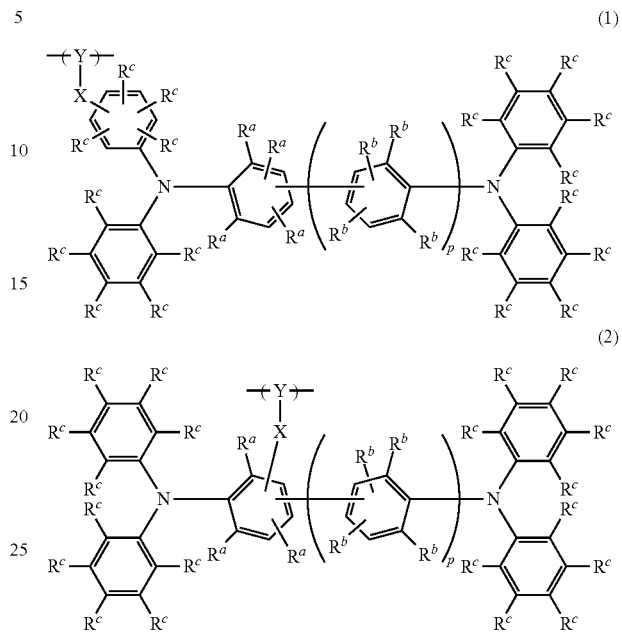

(2)

wherein in each of the formulae (1) and (2);

plural $R^a$s are each independently a hydrogen atom or an alkyl group having 1 to 10 carbon atoms, with at least one $R^a$ being the alkyl group having 1 to 10 carbon atoms;

plural $R^b$s are each independently a hydrogen atom or an alkyl group having 1 to 10 carbon atoms;

plural $R^c$s are each independently a hydrogen atom, a halogen atom, a cyano group, an amino group, an alkyl group having 1 to 10 carbon atoms, or an alkoxy group having 1 to 10 carbon atoms, and $R^c$s each bonded to neighboring carbon atoms in the same phenyl group may be bonded to one another to form a condensed ring;

X is a single bond, —O—, —S—, —SO—, —SO$_2$—, —NR$^1$— (wherein R$^1$ is a hydrogen atom, an alkyl group having 1 to 4 carbon atoms, or a phenyl group), —CO—, —COO—, or a divalent organic group having 1 to 20 carbon atoms (wherein the organic group may contain an atom or a group selected from the group consisting of —O—, —S—, —SO—, —SO$_2$—, —NR$^2$— (wherein R$^2$ is a hydrogen atom, an alkyl group having 1 to 4 carbon atoms, or a phenyl group), —CO— and —COO—.);

Y—X— is a group represented by:

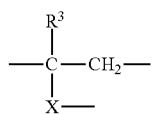

(wherein R$^3$ is a hydrogen atom or an alkyl group having 1 to 4 carbon atoms); and p is 0, 1, or 2.

[3] The composition for an anode buffer layer as described in the above [1], further comprising an organic solvent.

[4] A composition for an anode buffer layer comprising the high-molecular weight compound for an anode buffer layer as described in the above [2] and an organic solvent.

[5] An organic electroluminescence element comprising an anode, an anode buffer layer, a luminescent layer and a cathode that are laminated in this order, wherein the anode buffer layer is formed by heating the composition for an anode buffer layer of the above [1], [3] or [4], or the high-molecular weight compound for an anode buffer layer of the above [2].

[6] The organic electroluminescence element as described in the above [5], further comprising a cathode buffer layer.

[7] A method for producing an organic electroluminescence element comprising:

a first step of coating an anode with the composition for an anode buffer layer of the above [3] or [4], and then heating the composition to form an anode buffer layer, a second step of forming a luminescent layer on the anode buffer layer, and a third step of forming a cathode on the luminescent layer, wherein the second step is a step 2A or a step 2B, the said step 2A comprising:

coating a surface of the anode buffer layer with a hole transport layer-forming solution comprising a hole transport layer-forming material and an organic solvent, and then removing the organic solvent to form a hole transport layer which is contact with the anode buffer layer, and forming the luminescent layer on the hole transport layer, the said step 2B comprising:

coating a surface of the anode buffer layer with a luminescent layer-forming solution comprising a luminescent layer-forming material and an organic solvent, and then removing the organic solvent to form the luminescent layer which is in contact with the anode buffer layer.

[8] The method for producing an organic electroluminescence element as described in the above [7], wherein the second step is the step 2A, and the organic solvent contained in the hole transport layer-forming solution contains, as a constituent thereof, at least one constituent of the organic solvent contained in the composition for an anode buffer layer.

[9] The method for producing an organic electroluminescence element as described in the above [7], wherein the second step is the step 2B, and the organic solvent contained in the luminescent layer-forming solution contains, as a constituent thereof, at least one constituent of the organic solvent contained in the composition for an anode buffer layer.

[10] The method for producing an organic electroluminescence element as described in any one of the above [7] to [9], wherein the heating is carried out at 100 to 350° C. for 10 to 180 minutes.

[11] A display apparatus comprising the electroluminescence element of the above [5] or [6].

[12] A light irradiating apparatus comprising the electroluminescence element of the above [5] or [6].

Effect of the Invention

By using the composition for an anode buffer layer or the high-molecular weight compound for an anode buffer layer of the invention, an organic solvent is employable as a solvent of an anode buffer layer-forming solution, and an anode buffer layer is formed which does not dissolve even when coated with a luminescent layer-forming material solution containing an organic solvent as a solvent; and furthermore, an organic EL element is produced which has high electrical power efficiency and long life.

EMBODIMENTS FOR CARRYING OUT THE INVENTION

Composition for Anode Buffer Layer

Figure 1:
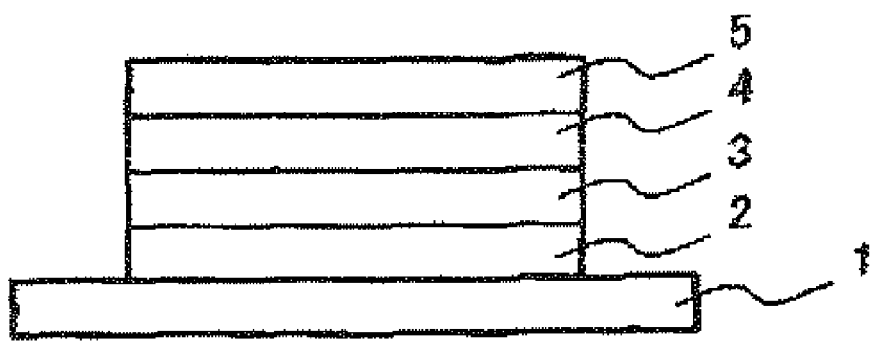
FIG. 1 is a cross sectional view of an example of an organic EL element according to the invention.

The composition for an anode buffer layer of the present invention comprises a particular high-molecular weight compound, which is a host material, (hereinafter, also referred to as a "high-molecular weight compound for a host") and an electron-accepting compound, which is a dopant.

<High-Molecular Weight Compound for Host>
(Particular Structural Unit)

The high-molecular weight compound for a host has a structural unit represented by the following formula (1) or the following formula (2) (hereinafter, also referred to as a "particular structural unit").

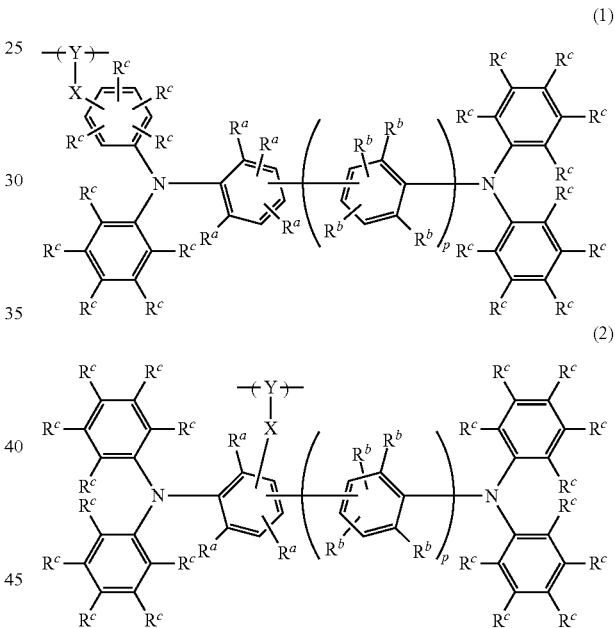

In each of the formulae (1) and (2):

plural $R^a$s are each independently a hydrogen atom or an alkyl group having 1 to 10 carbon atoms, with at least one $R^a$ being the alkyl group having 1 to 10 carbon atoms;

plural $R^b$s are each independently a hydrogen atom or an alkyl group having 1 to 10 carbon atoms;

plural $R^c$s are each independently a hydrogen atom, a halogen atom, a cyano group, an amino group, an alkyl group having 1 to 10 carbon atoms, or an alkoxy group having 1 to 10 carbon atoms, and $R^c$s each bonded to neighboring carbon atoms in the same phenyl group may be bonded to one another to form a condensed ring;

X is a single bond, —O—, —S—, —SO—, —SO$_2$—, —NR$^1$— (wherein R$^1$ is a hydrogen atom, an alkyl group having 1 to 4 carbon atoms, or a phenyl group), —CO—, —COO—, or a divalent organic group having 1 to 20 carbon atoms (wherein the organic group may contain an atom or a group selected from the group consisting of —O—, —S—, —SO—, —SO$_2$—, —NR$^2$— (wherein R$^2$ is a hydrogen atom, an alkyl group having 1 to 4 carbon atoms, or a phenyl group), —CO— and —COO—);

Y—X— is a group represented by:

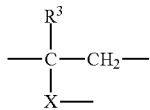

(wherein $R^3$ is a hydrogen atom or an alkyl group having 1 to 4 carbon atoms); and p is 0, 1, or 2, preferably 0 or 1.

In each of the formulae (1) and (2), at least one $R^a$ is an alkyl group having 1 to 10 carbon atoms, whereby in the production of the organic EL element described later, an organic solvent is employable as a solvent of an anode buffer layer-forming solution, and an anode buffer layer is formed which does not dissolve even when coated with a luminescent layer-forming material solution containing an organic solvent as a solvent (the fact that the anode buffer layer does not dissolve even when coated with the luminescent layer-forming material solution containing an organic solvent as a solvent is also referred to as "insolubilization of an anode buffer layer"); and furthermore an organic EL element is produced which has high electrical power efficiency and long life.

In a benzene ring having $R^a$ in the formulae (1) and (2), preferably, at least one $R^a$ present at an ortho position with respect to N (a nitrogen atom) is an alkyl group.

In each benzene ring having $R^b$, preferably, at least one $R^b$ present at an ortho position with respect to N (a nitrogen atom) is an alkyl group, too.

When an alkyl group is present at an ortho position with respect to N (a nitrogen atom) as described above, it is presumed that a torsion of a triphenylamine skeleton in the above particular structural unit is large and the insolubilization of the anode buffer layer is more promoted.

Accordingly, as a partial structure represented by:

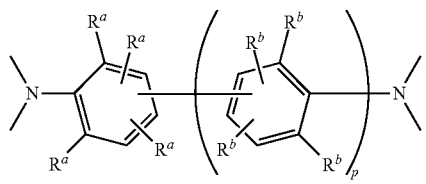

in the above particular structural unit represented by the formula (1), preferred examples include the following structures:

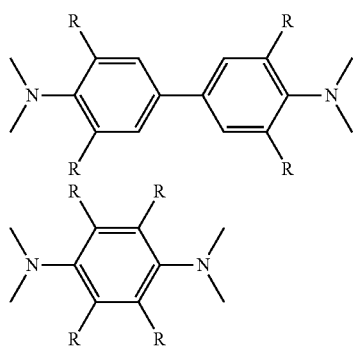

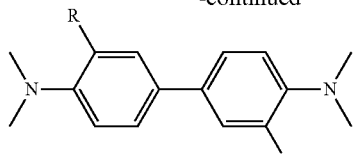

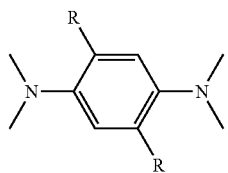

wherein, R is an alkyl group having 1 to 10 carbon atoms; the same applies hereinafter.

Particularly preferred examples include the following structures.

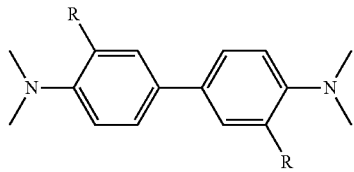

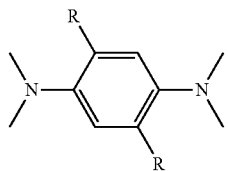

In a similar manner, as a partial structure represented by:

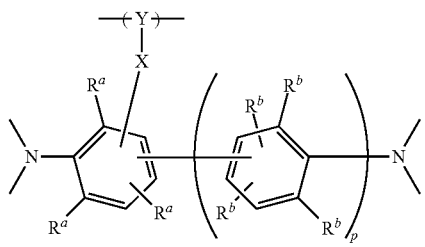

in the above particular structural unit represented by the formula (2), preferred examples include the following structures.

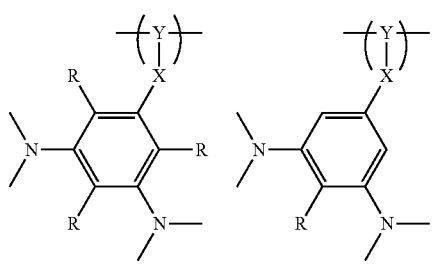

Particularly preferred examples include the following structures.

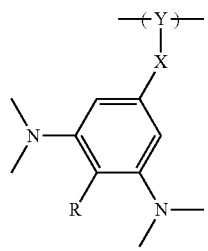

Examples of the alkyl group in the $R^a$ include a methyl group, an ethyl group, a propyl group, an isopropyl group, a butyl group, an isobutyl group, a tertiary butyl group, an amyl group, and a hexyl group. In view of the easiness of synthesizing monomers for deriving the above particular structural unit, preferred are a methyl group, an ethyl group and an isopropyl group, and particularly preferred is a methyl group.

Examples of the alkyl group in the $R^b$ can be the specific examples of the alkyl group for the $R^a$. In view of the easiness of synthesizing monomers for deriving the above particular structural unit, preferred are a methyl group, an ethyl group and an isopropyl group, and particularly preferred is a methyl group.

In view of the solubility of the high-molecular weight compound for a host in an organic solvent and the homogenization of the solution, at least one (e.g., one) $R^c$ per one benzene ring is preferably an alkyl group or an alkoxy group.

Examples of the alkyl group in the $R^c$ can be the specific examples of the alkyl group for the $R^a$, and preferred are a methyl group, an ethyl group, a propyl group, a butyl group and a tertiary group, and particularly preferred is a methyl group.

Examples of the halogen atom in the $R^c$ include a fluorine atom, a chlorine atom, a bromine atom and an iodine atom; and preferred is a fluorine atom.

Examples of the alkoxy group in the $R^c$ include a methoxy group, an ethoxy group, a propoxy group, a butoxy group, an isopropoxy group, an isobutoxy group and a tertiary butoxy group; preferred are a methoxy group, an ethoxy group, a propoxy group and a butoxy group; and particularly preferred is a methoxy group. An example of the condensed ring is a naphthylene group.

X is a single bond, —O—, —S—, —SO—, —SO$_2$—, —NR$^1$— (wherein R$^1$ is a hydrogen atom, an alkyl group having 1 to 4 carbon atoms, or a phenyl group), —CO—, —COO—, or a divalent organic group having 1 to 20 carbon atoms (wherein the organic group may contain an atom or a group selected from the group consisting of —O—, —S—, —SO—, —SO$_2$—, —NR$^2$— (wherein R$^2$ is a hydrogen atom, an alkyl group having 1 to 4 carbon atoms, or a phenyl group), —CO— and —COO—). Among these, preferred are a single bond, —CO—, —COO—, and a divalent organic group having 1 to 20 carbon atoms (wherein the organic group may contain an atom or a group selected from the group consisting of —O—, —CO— and —COO—).

As the structure represented by the Y—X—, preferred are Y— (X is a single bond), Y—O—, Y—COO— and a group represented by any of the following formulae (S1) to (S3) (in the following formulae (S1) to (S3), n is an integer of 0 to 5).

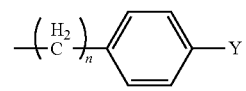
(S1)

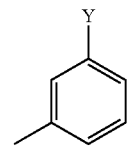
(S2)

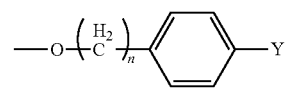
(S3)

A polymerizable functional group y for deriving Y is a group represented by CH$_2$=CR$^3$— (wherein R$^3$ is a hydrogen atom or an alkyl group having 1 to 4 carbon atoms), such as a vinyl group and an isopropenyl group. Among these, the vinyl group is preferred.

As a partial structure containing a polymerizable functional group for deriving the structure represented by Y—X—, specifically, partial structures represented by the following formulae (A1) to (A13) are preferred. Among these, more preferred are partial structures represented by the following structures represented by the following formulae (A1), (A5), (A8) and (A12) because these can be easily introduced into monomers for deriving the particular structural unit.

(A1)

(A2)

(A3)

(A4)

(A5)

(A6)

-continued
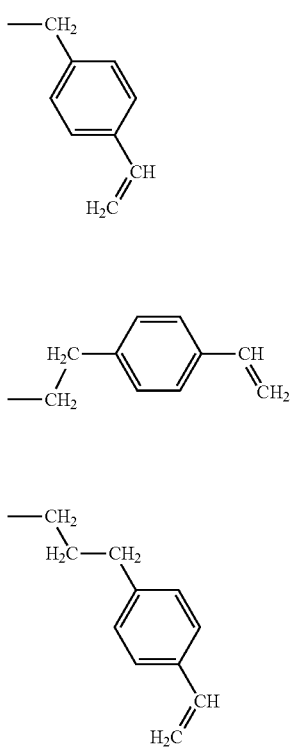
(A7)
(A8)
(A9)
(A10)
(A11)
(A12)
(A13)
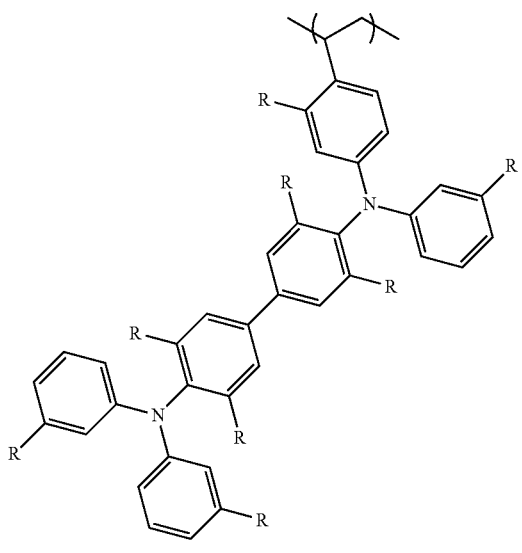
B-1
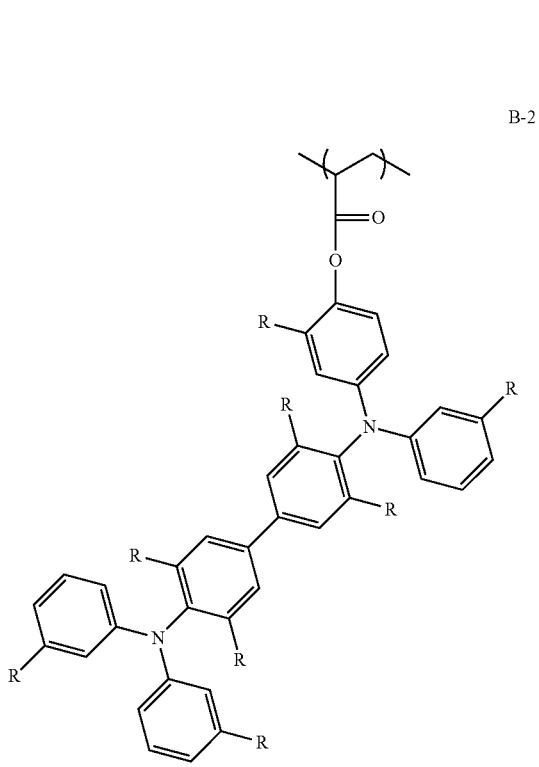
B-2
(Specific Examples of Particular Structural Unit)
Specific examples of the above particular structural unit include a structural unit represented by any of the following formulae (B-1) to (B-21).

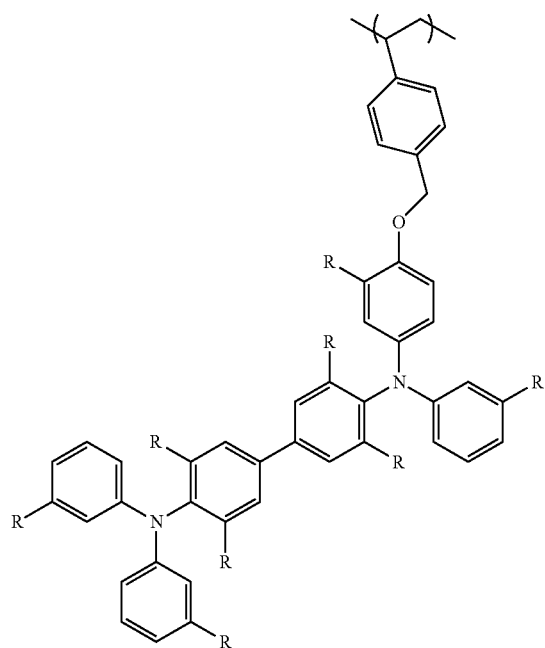
B-3
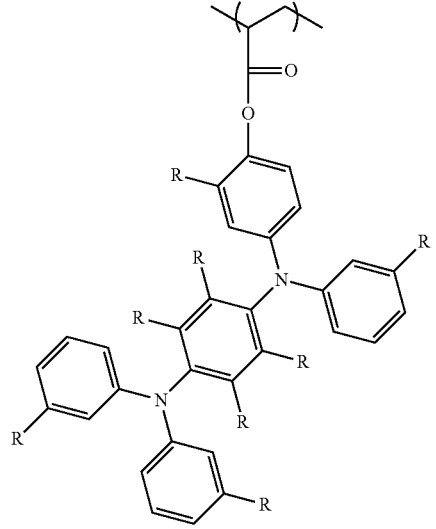
B-6
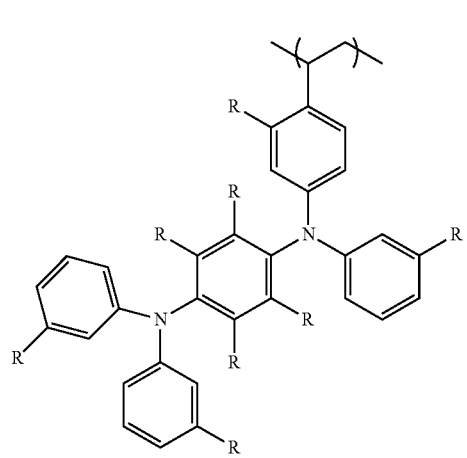
B-4
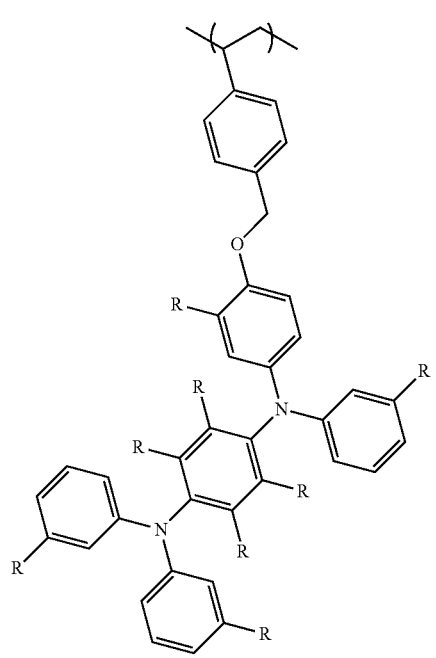
B-7
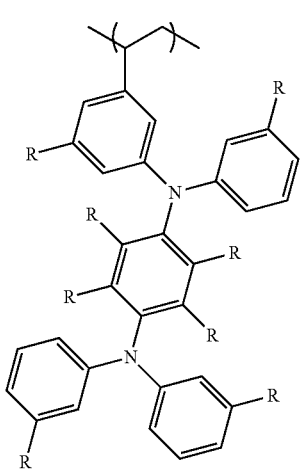
B-5
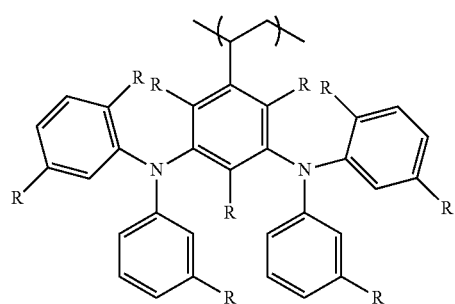
B-8

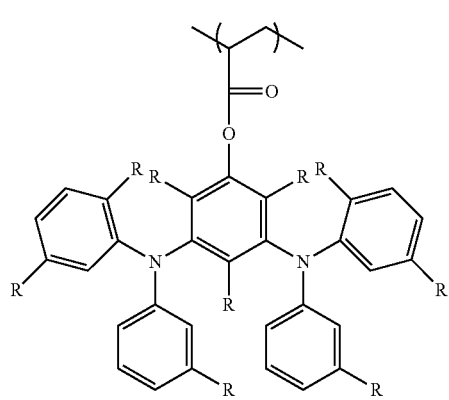
B-9
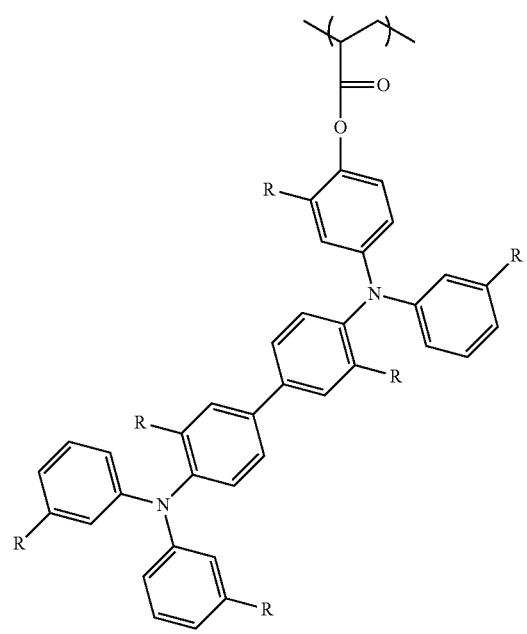
B-12
B-10
B-11
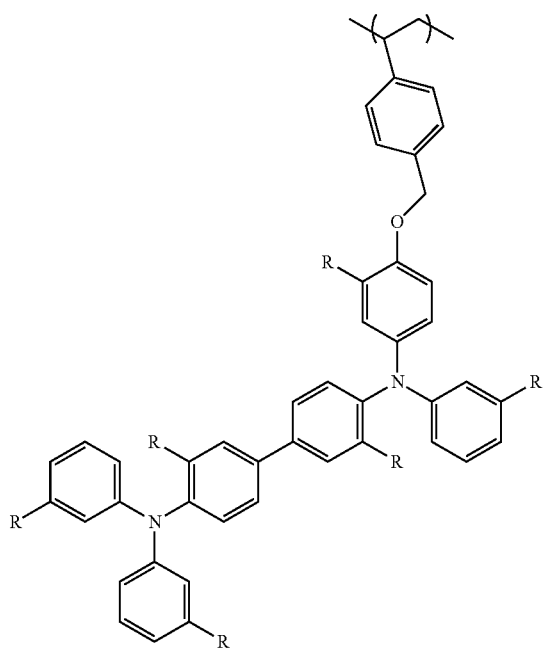
B-13

-continued
B-14
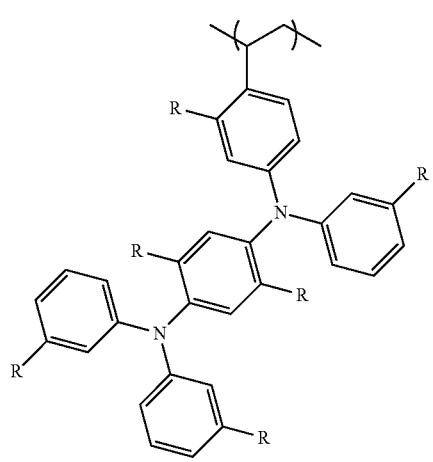
B-15
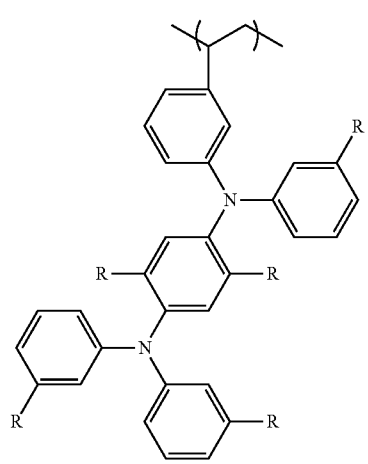
B-16
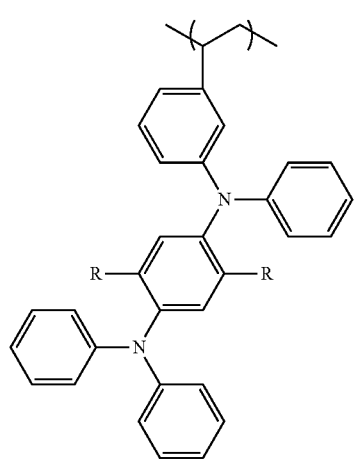
-continued
B-17
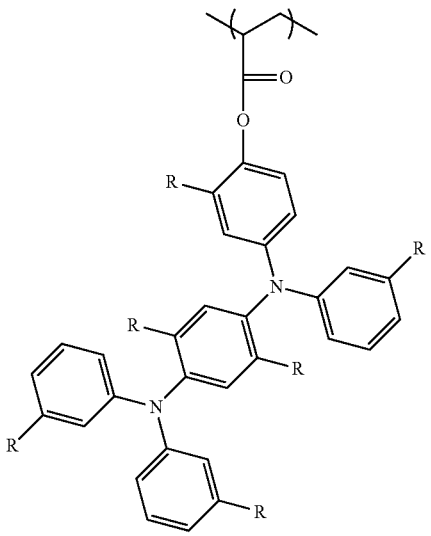
B-18
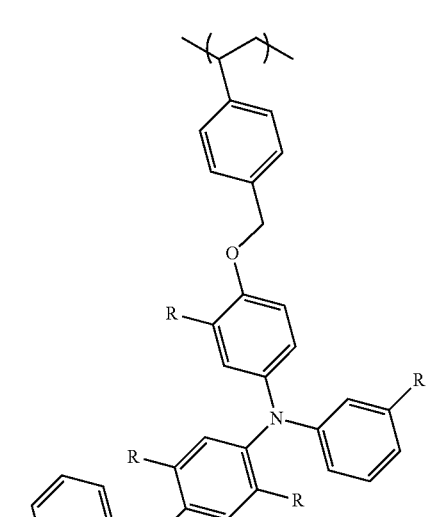
B-19
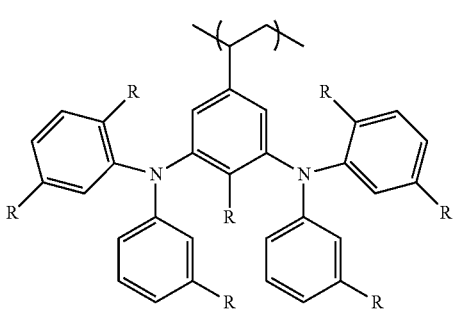

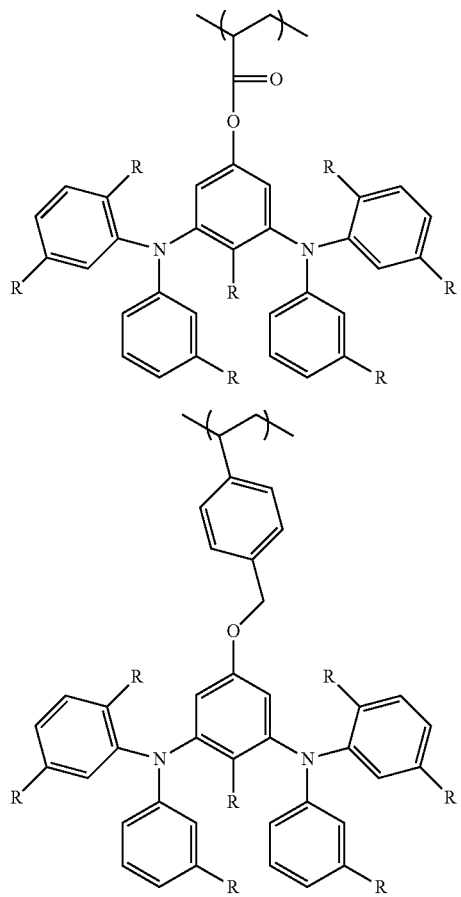
B-20
B-21
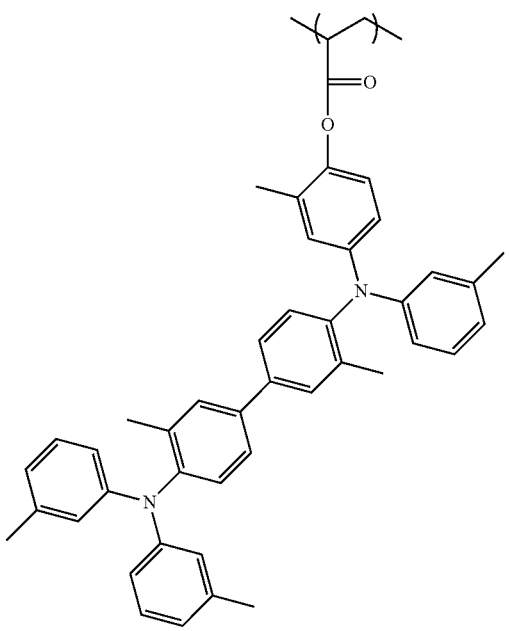
B-23
Among these, the structural unit represented by any of the formulae (B-11) to (B-21) is preferred.
More preferred specific examples of the above particular structural unit include a structural unit represented by any of the following formulae (B-22) to (B-32).
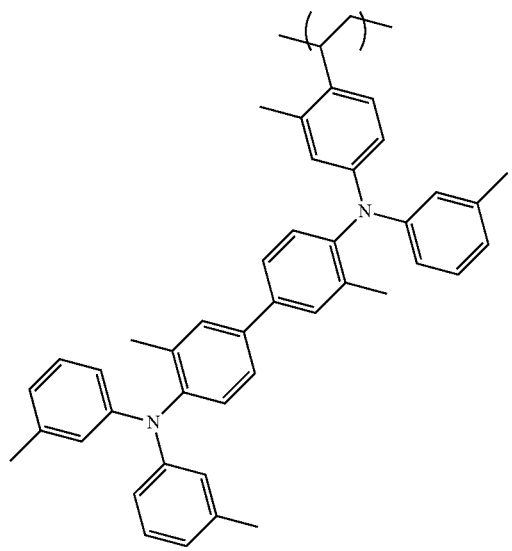
B-22
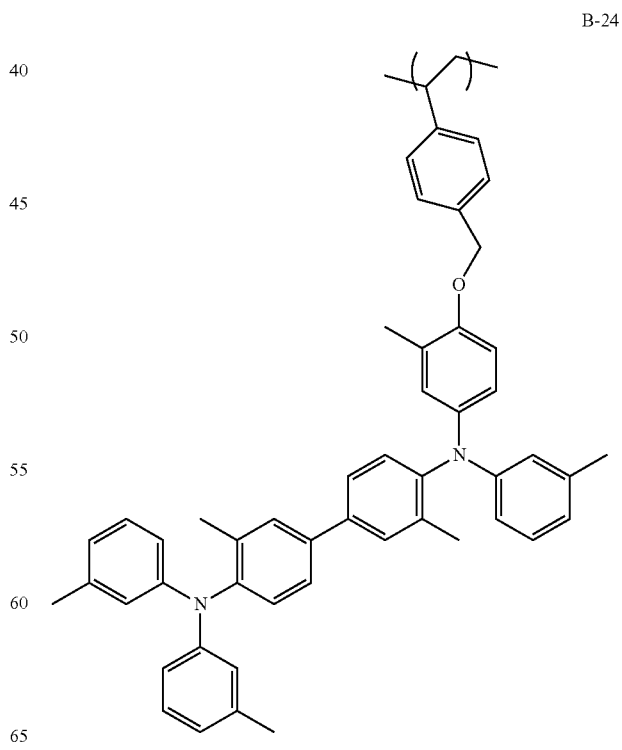
B-24

B-25
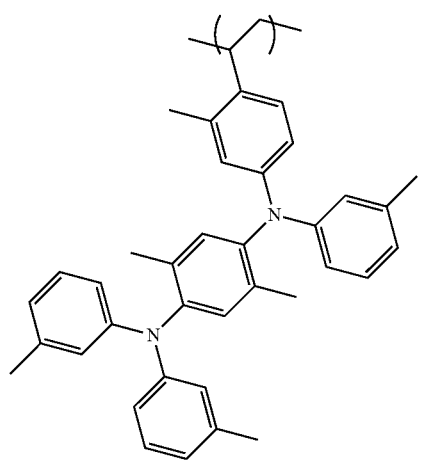
B-28
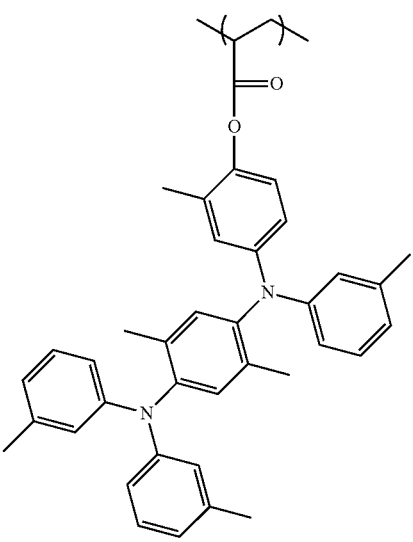
B-26
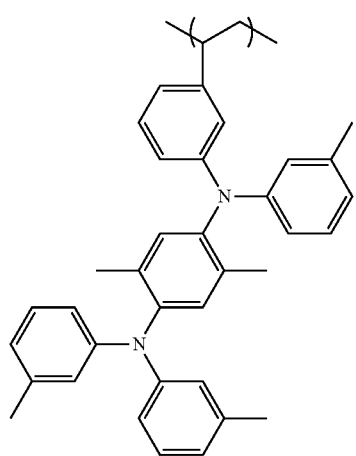
B-29
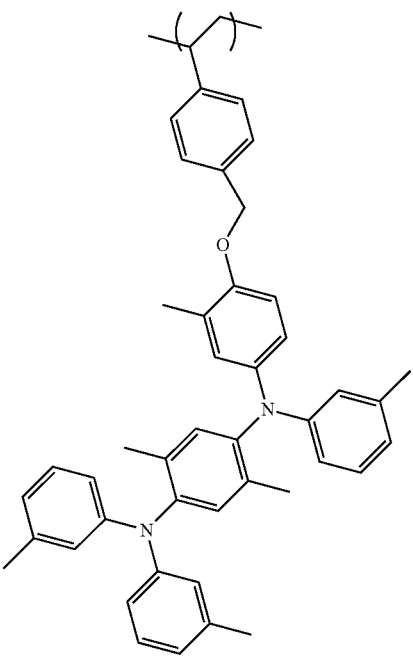
B-27
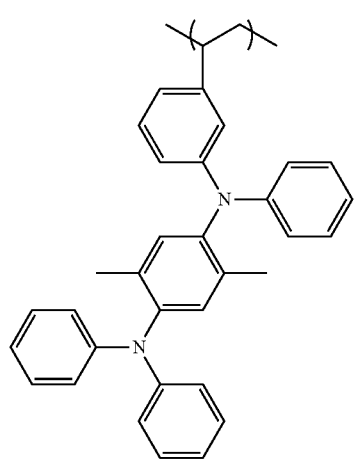
B-30
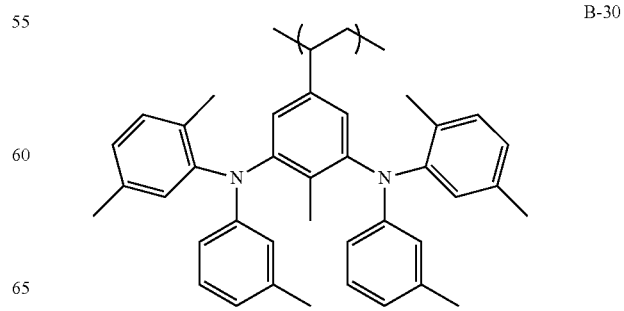

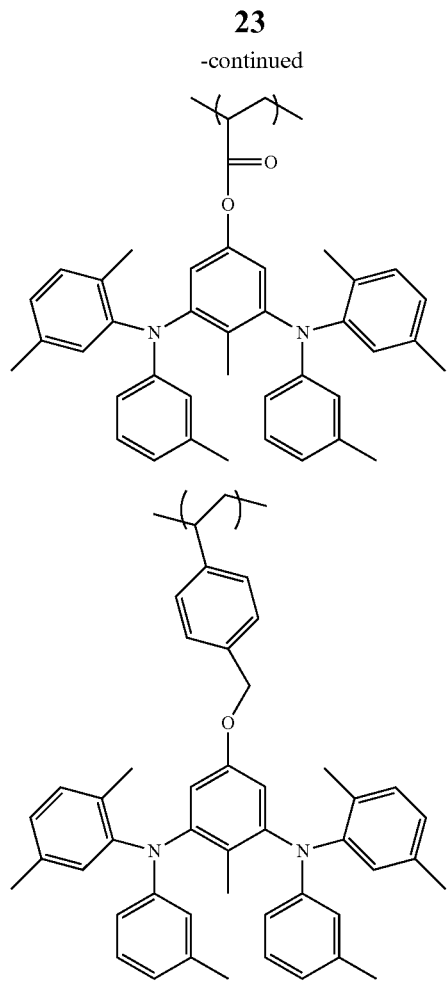

B-31

B-32

Among these, the structural unit represented by any of the formulae (B-22), (B-26), (B-27) and (B-30) is particularly preferred.

The high-molecular weight compound for a host may comprise a single kind of the above particular structural unit or two or more kinds of the above particular structural unit.

(Method for Producing Monomer for Deriving Particular Structural Unit)

A monomer for deriving the above particular structural unit can be produced by a hitherto known method, e.g., a method as described below.

<Exemplary Method for Producing Monomer for Deriving Structural Unit Represented by Formula (1)>

As illustrated below, a biphenyl diamine derivative (m-1) and a halogenated aryl derivative (m-3) are subjected to a coupling reaction using a general palladium catalyst, in a solvent (e.g., toluene and xylene), thereby deriving (m-4) and (m-4').

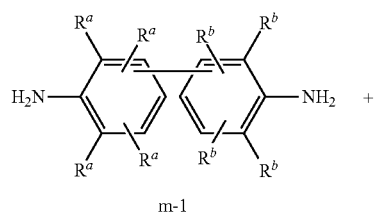

m-1

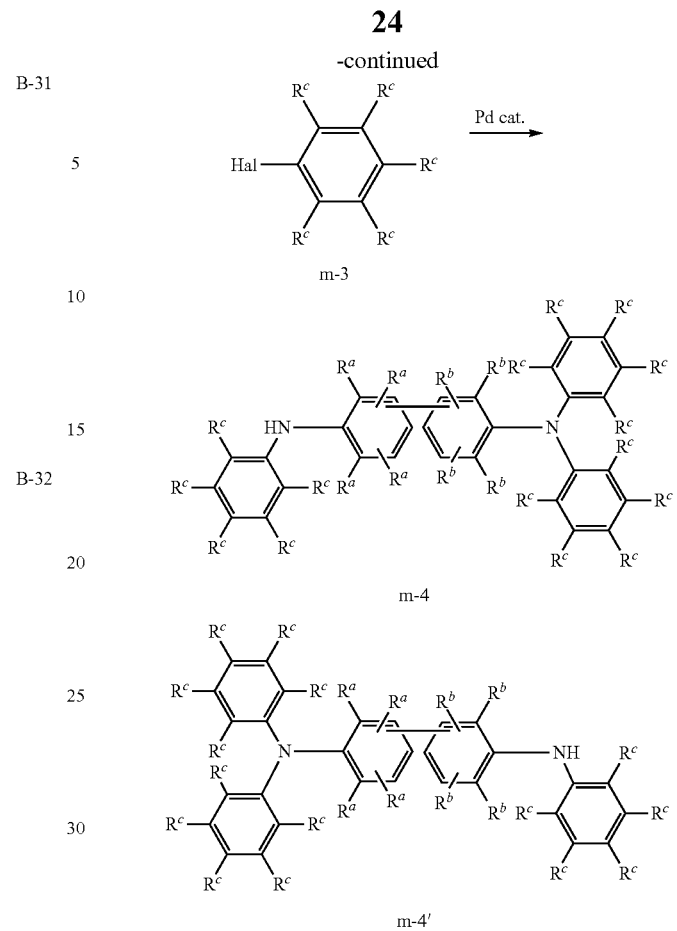

m-3 m-4 m-4'

Then, as illustrated below, (m-4) and (m-4'), and a halogenated aryl (m-6) having a polymerizable substituent are subjected to a coupling reaction using a general palladium catalyst, thereby producing (m-7), which is one of the monomers for deriving the structural unit represented by the formula (1), together with (m-7').

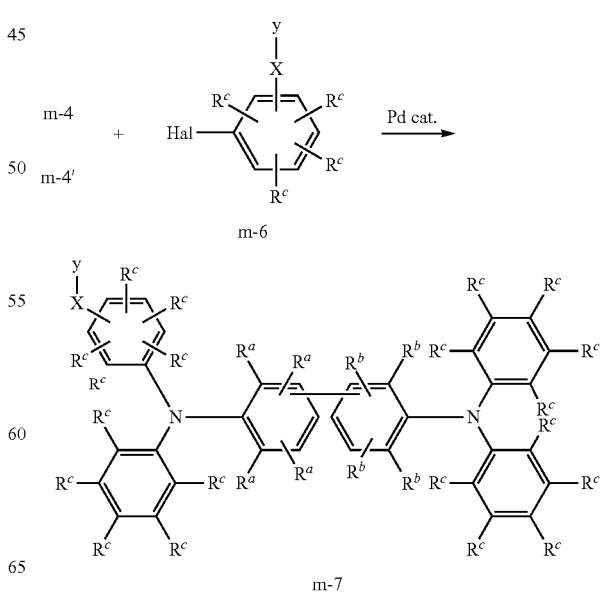

m-4
+
m-4' m-6 m-7

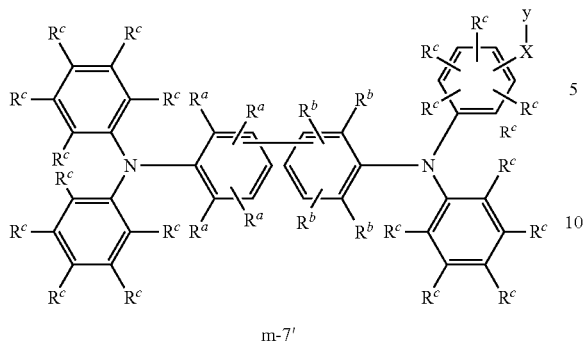

m-7′

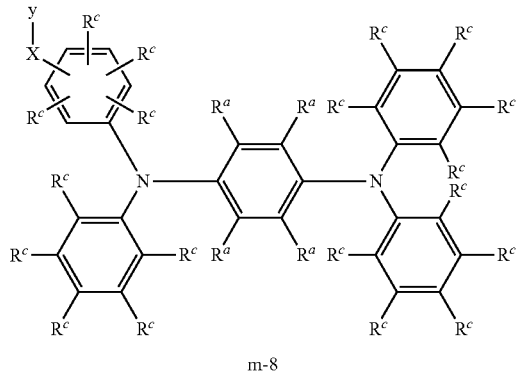

m-8

Furthermore, as illustrated below, a phenyl diamine derivative (m-2) and the halogenated aryl derivative (m-3) are subjected to a coupling reaction using a general palladium catalyst, in a solvent (e.g., toluene and xylene), thereby deriving (m-5). Then, (m-5) and the halogenated aryl (m-6) having a polymerizable substituent are subjected to a coupling reaction using a general palladium catalyst, thereby deriving (m-8), which is one of the monomers for deriving the structural unit represented by the formula (1).

<Exemplary Method for Producing Monomer for Deriving Structural Unit Represented by Formula (2)>

As illustrated below, (m-9) and a diarylamine (m-10) are subjected to a coupling reaction using a general palladium catalyst, in a solvent (e.g., toluene and xylene), thereby producing (m-11), which is one of the monomers for deriving the structural unit represented by the formula (2).

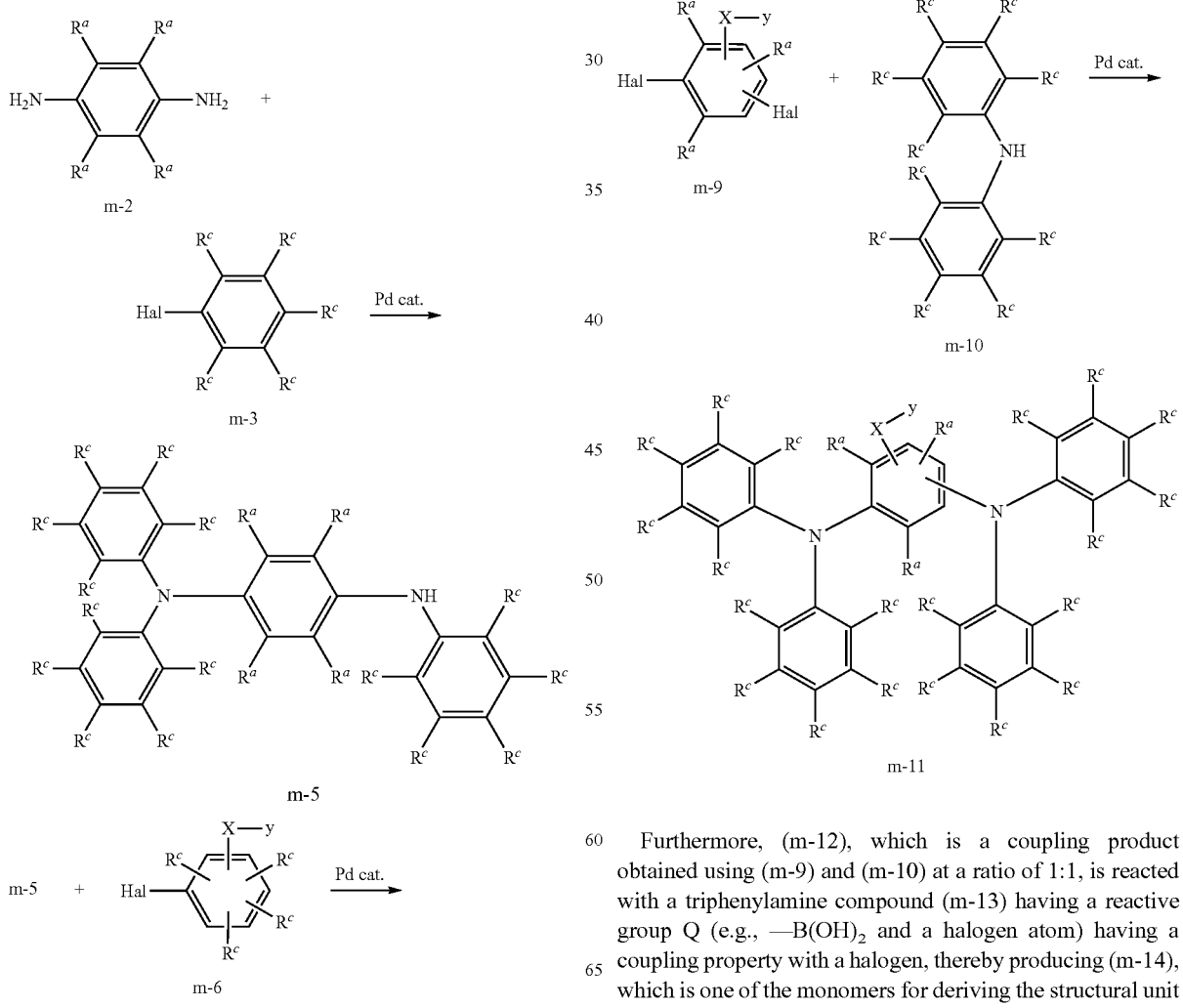

Furthermore, (m-12), which is a coupling product obtained using (m-9) and (m-10) at a ratio of 1:1, is reacted with a triphenylamine compound (m-13) having a reactive group Q (e.g., —B(OH)$_2$ and a halogen atom) having a coupling property with a halogen, thereby producing (m-14), which is one of the monomers for deriving the structural unit represented by the formula (2).

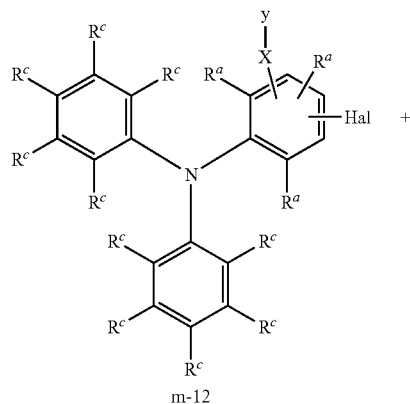

m-12

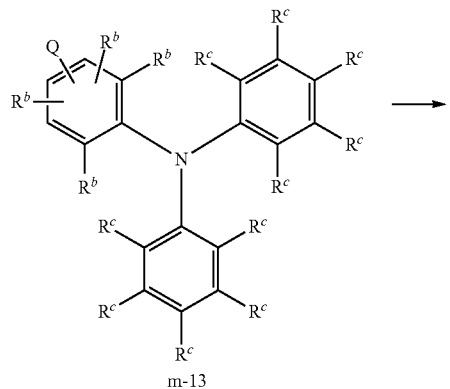

m-13

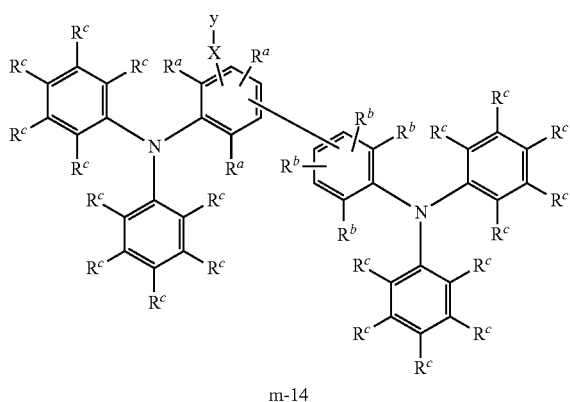

m-14

$R^a$, $R^b$, $R^c$ and X in the formulae (m-1) to (m-14) are defined in the same manner as $R^a$, $R^b$, $R^c$ and X in the formulae (1) and (2), respectively. y is a polymerizable substituent for deriving Y in the formulae (1) and (2).

(Other Structural Unit)

The high-molecular weight compound for a host may be a homopolymer comprising the above particular structural unit alone, or may be a copolymer further comprising a structural unit other than the above particular structural unit (hereinafter, also referred to as "other structural unit").

Specific examples of the above other structural unit include a structural unit represented by the following formula (3) and a structural unit represented by the following formula (4).

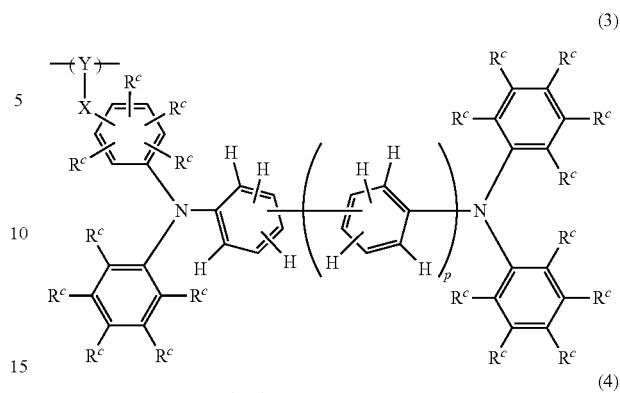

(3)

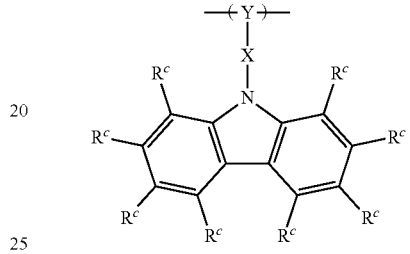

(4)

In each of the formulae (3) and (4);

plural $R^c$s are each independently a hydrogen atom, a halogen atom, a cyano group, an amino group, an alkyl group having 1 to 10 carbon atoms, or an alkoxy group having 1 to 10 carbon atoms, and $R^c$s each bonded to neighboring carbon atoms in the same phenyl group may be bonded to one another to form a condensed ring;

X is a single bond, —O—, —S—, —SO—, —SO$_2$—, —NR$^1$— (wherein R$^1$ is a hydrogen atom, an alkyl group having 1 to 4 carbon atoms, or a phenyl group), —CO—, —COO—, or a divalent organic group having 1 to 20 carbon atoms (wherein the organic group may contain an atom or a group selected from the group consisting of —O—, —S—, —SO—, —SO$_2$—, —NR$^2$— (wherein R$^2$ is a hydrogen atom, an alkyl group having 1 to 4 carbon atoms, or a phenyl group), —CO— and —COO—.);

Y—X— is a group represented by:

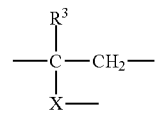

(wherein R$^3$ is a hydrogen atom or an alkyl group having 1 to 4 carbon atoms); and p is 0, 1, or 2, preferably 0 or 1.

Specific examples and preferred embodiments of $R^c$ in the formula (3) can be the specific examples and preferred embodiments of $R^c$ in the formulae (1) and (2).

Specific examples and preferred embodiments of X in the formula (3) can be the specific examples and preferred embodiments of X in the formulae (1) and (2).

Specific examples and preferred embodiments of Y—X— in the formula (3) can be the specific examples and preferred embodiments of Y—X— in the formulae (1) and (2). The polymerizable functional group y for deriving Y is preferably a vinyl group.

In a similar manner, specific examples and preferred embodiments of $R^c$ in the formula (4) can be the specific examples and preferred embodiments of $R^c$ in the formulae (1) and (2).

Specific examples and preferred embodiments of X in the formula (4) can be the specific examples and preferred embodiments of X in the formulae (1) and (2).

Specific examples and preferred embodiments of Y—X— in the formula (4) can be the specific examples and preferred embodiments of Y—X— in the formulae (1) and (2). The polymerizable functional group y for deriving Y is preferably a vinyl group.

Specific examples of the other structural unit include the following structural units.

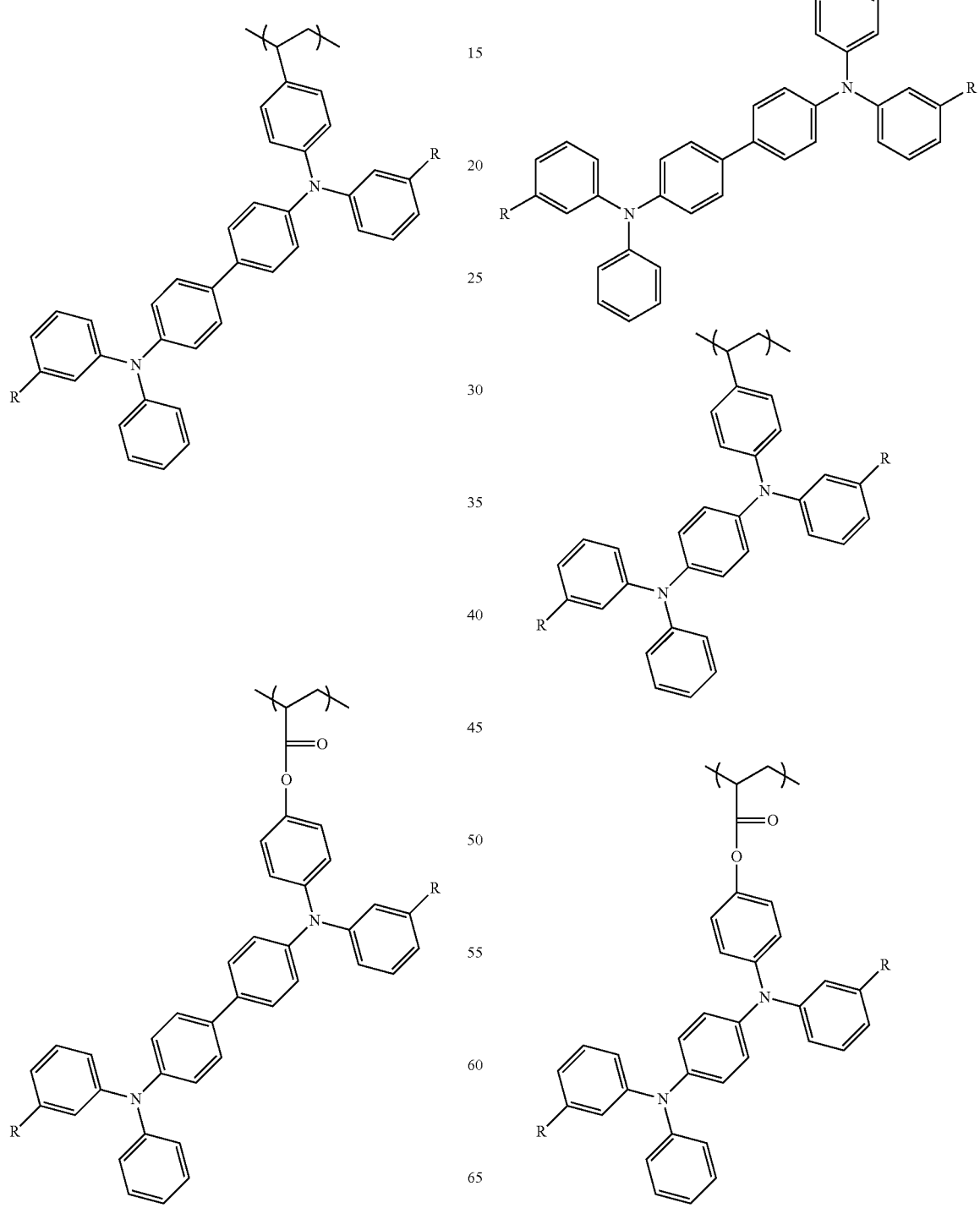

31
-continued
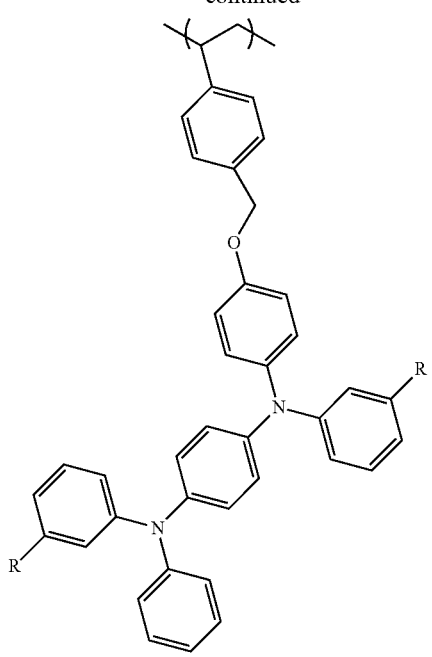
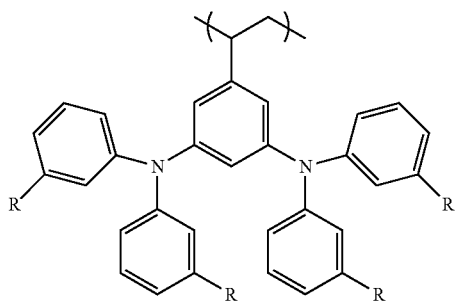
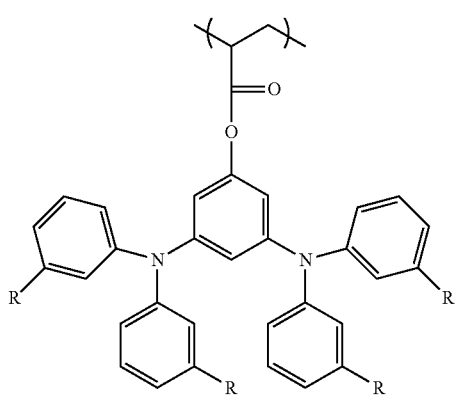
32
-continued
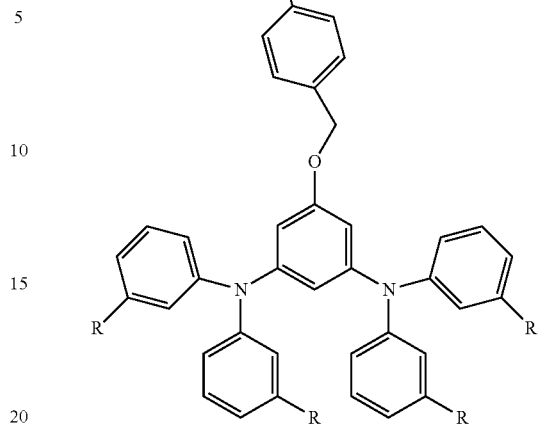
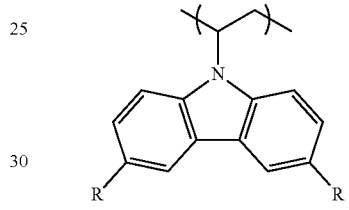
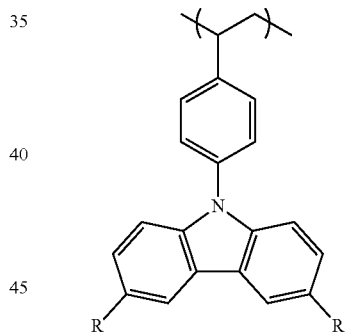
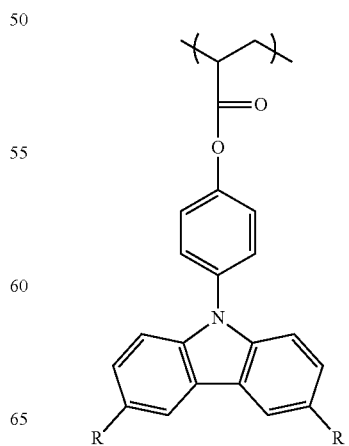

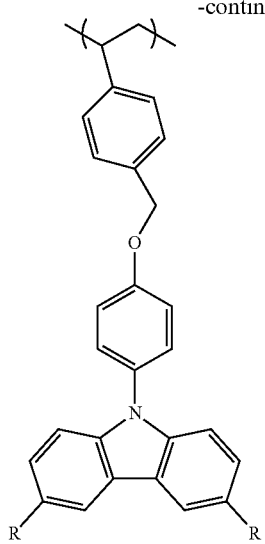
Preferred specific examples of the other structural unit include the following structural units.
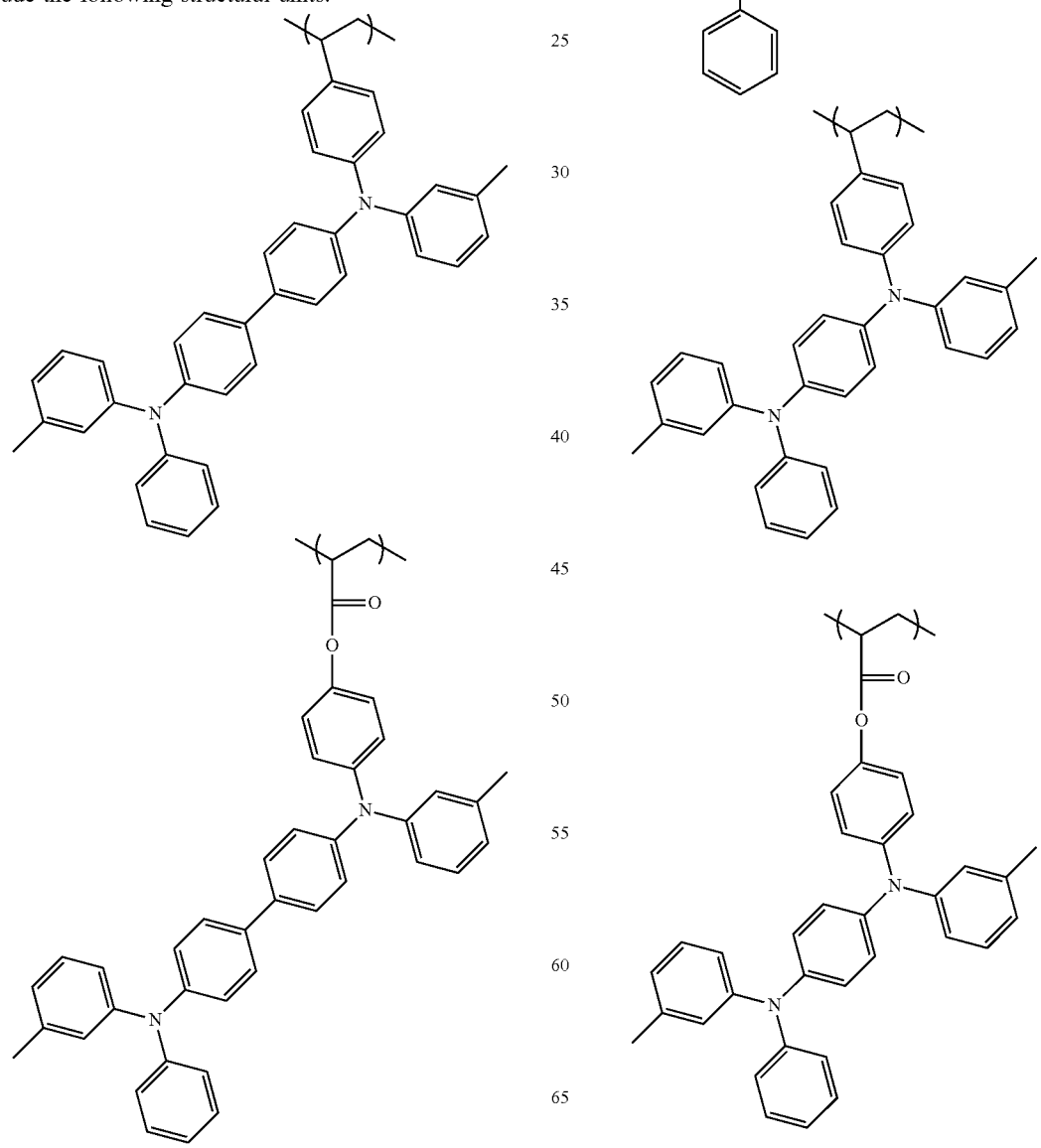
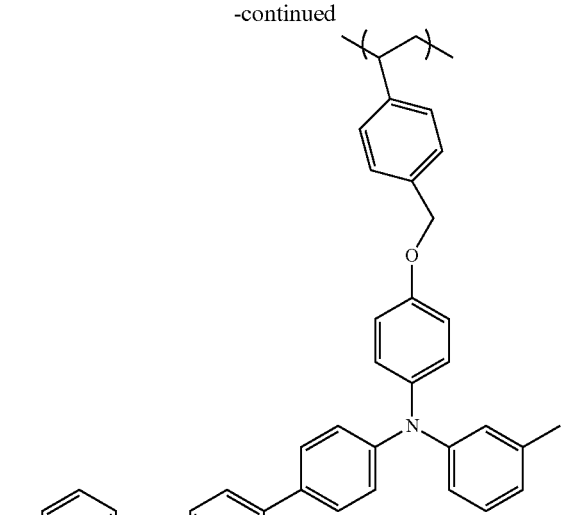

35
-continued
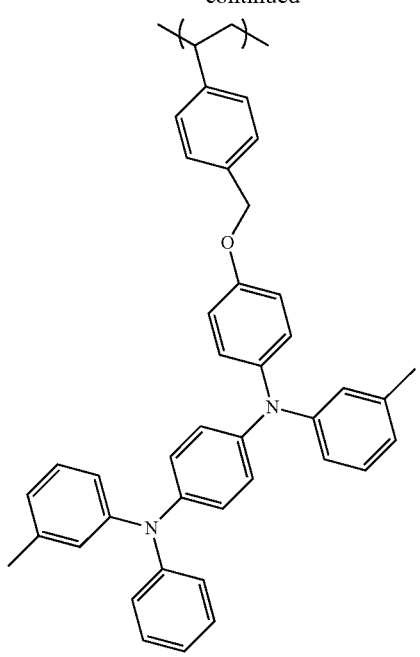
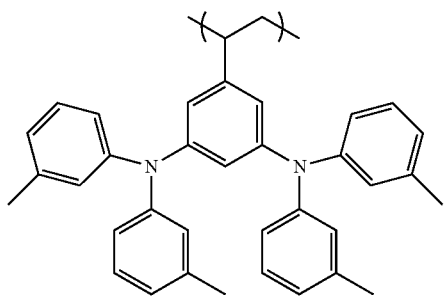
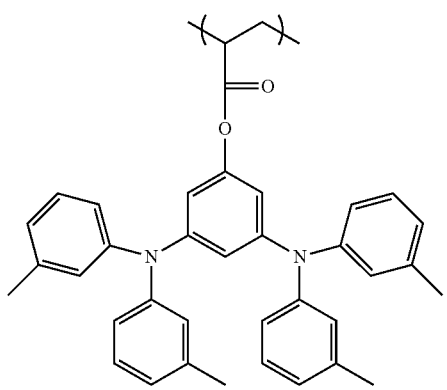
36
-continued
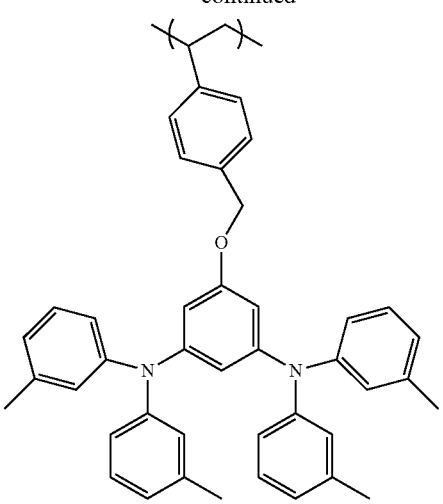
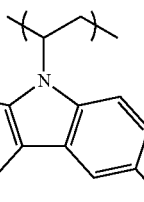
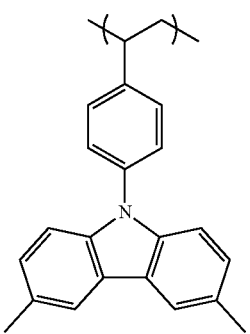
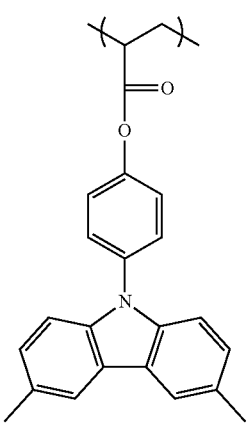

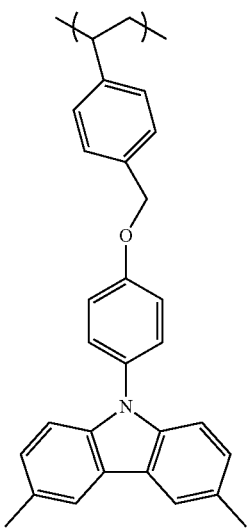

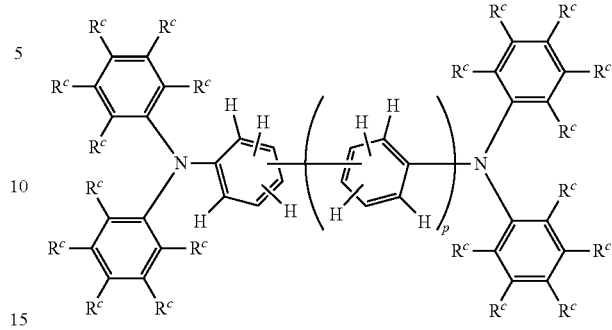

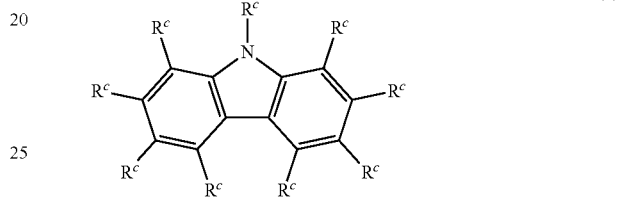

(High-Molecular Weight Compound for Host)

The high-molecular weight compound for a host may be a homopolymer comprising the above particular structural unit alone, or may be a copolymer further comprising the above other structural unit. This copolymer may be a random copolymer or a block copolymer.

In view of the insolubilization of the anode buffer layer, the high-molecular weight compound for a host comprises the above particular structural unit preferably in an amount of 80% by mol or more, more preferably 90% by mol or more, still more preferably 95% by mole or more.

In view of the insolubilization of the anode buffer layer, the high-molecular weight compound for a host usually has a weight average molecular weight as measured by GPC (gel permeation chromatography) of not less than 20,000, more preferably not less than 50,000, still more preferably not less than 100,000. The upper limit is about 1,000,000 in view of the solubility of the high-molecular weight compound for a host itself. A value of this weight average molecular weight is a value measured in accordance with a measurement method in Examples described later.

The high-molecular weight compound for a host can be produced by an ordinary method in polymer production, except that the production employs, as a raw material, the monomer for deriving the above particular structural unit, and optionally employs the monomer for deriving the above other structural unit. The polymerization method may be any of radical polymerization, cation polymerization, anion polymerization and addition polymerization, and is preferably radial polymerization.

<Low-Molecular Weight Compound for Host>

The composition for an anode buffer layer of the invention may comprise a low-molecular weight compound for a host. Specific examples of the low-molecular weight compound for a host include a compound represented by the following formula (5) and a compound represented by the following formula (6).

In each of the formulae (5) and (6);

plural $R^c$s are each independently a hydrogen atom, a halogen atom, a cyano group, an amino group, an alkyl group having 1 to 10 carbon atoms, or an alkoxy group having 1 to 10 carbon atoms, and $R^c$s each bonded to neighboring carbon atoms in the same phenyl group may be bonded to one another to form a condensed ring; and p is 0, 1, or 2, preferably 0 or 1.

Specific examples and preferred embodiments of $R^c$ in the formula (5) can be the specific examples and preferred embodiments of $R^c$ in the formula (3).

Specific examples and preferred embodiments of $R^c$ in the formula (6) can be the specific examples and preferred embodiments of $R^c$ in the formula (4).

Examples of the low-molecular weight compound for a host include compounds as described below.

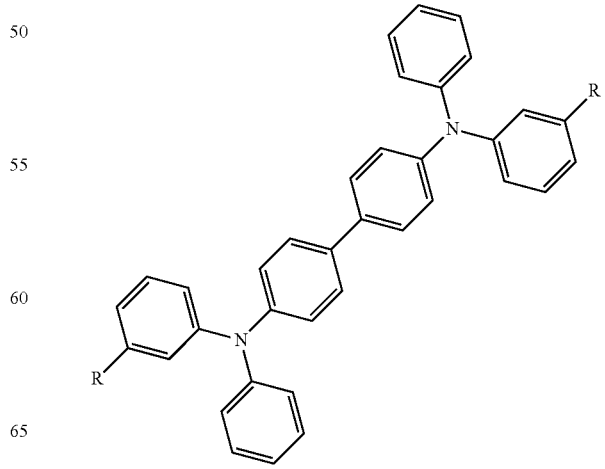

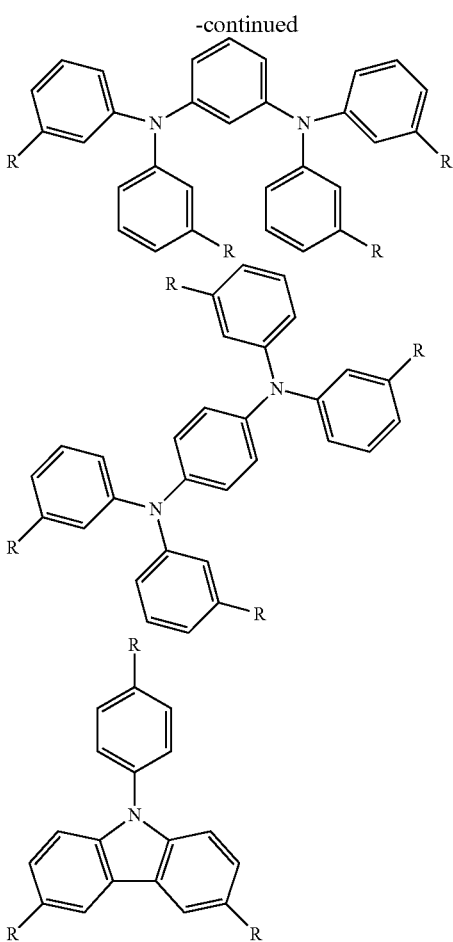

<Electron-Accepting Compound>

Examples of the electron-accepting compound include known compounds, such as N,N'-dicyano-2,3,5,6-tetrafluoro-1,4-quinonediimine (F4DCNQI), N'N-dicyano-2,5-dichloro-1,4-quinonediimine (C12DCNQI), N,N'-dicyano-2,5-dichloro-3,6-difluoro-1,4-quinonediimine (C12F2DCNQI), N'N-dicyano-2,3,5,6,7,8-hexafluoro-1,4-naphthoquinonediimine (F6DCNNOI), 1,4,5,8-tetrahydro-1,4,5,8-tetrathia-2,3,6,7-tetracyanoanthraquinone (CN4TTAQ), 7,7,8,8-tetracyanoquinodimethane (TCNQ), 2,3,5,6-tetrafluoro-7,7,8,8-tetracyanoquinodimethane (F4TCNQ), 2,5-bis(2-hydroxyethoxy)-7,7,8,8-tetracyanoquinodimethane, 2,5-difluoro-7,7,8,8-tetracyanoquinodimethane, bis(tetrabutylammonium)tetracyanodiphenoquinodimethanide, 2,5-dimethyl-7,7,8,8-tetracyanoquinodimethane, 2-fluoro-7,7,8,8-tetracyanoquinodimethane, and 11,11,12,12-tetracyanonaphtho-2,6-quinodimethane.

Of these, TCNQ and F4TCNQ are preferred, which have a high solubility in an organic solvent (e.g., toluene) and is capable of forming an anode buffer layer with high uniformity.

<Composition for Anode Buffer Layer>

The composition for an anode buffer layer of the invention comprises the high-molecular weight compound for a host and the electron-accepting compound.

The electron-accepting compound is contained usually in an amount of 0.1 to 20 parts by mass, preferably 0.5 to 10 parts by mass, more preferably 1 to 5 parts by mass, based on 100 parts by mass of a total of the high-molecular weight compound for a host and the low-molecular weight compound for a host, which is an optional component. When the amount is within the above range, the anode buffer layer exhibits sufficient charge injection ability. On the other hand, if the amount is more than the above range, deterioration of the organic EL element may be caused by the crystallization of the electron-accepting compound and the like.

The low-molecular weight compound for a host is used in an amount of 3 to 20 parts by mass, preferably 5 to 10 parts by mass, based on 100 parts by mass of the high-molecular weight compound for a host.

The composition may further comprise an organic solvent.

The composition comprising the organic solvent is employable as a coating liquid for forming an anode buffer layer.

As the organic solvent, various organic solvents are employable, with examples thereof including aromatic solvents such as toluene, xylene and anisole, and halogenated alkyl solvents such as chloroform and dichloroethane. The organic solvent may be composed of two or more kinds of components (e.g., xylene and toluene).

The content of the organic solvent in the composition can be arbitrarily determined in view of the thickness and the formation conditions of the anode buffer layer to be formed. As a guide, the organic solvent is prepared such that the content of solid components (a total amount of components excluding the organic solvent) in the composition is preferably 0.1 to 4% by mass, more preferably 0.4 to 2% by mass.

[High-Molecular Weight Compound for Anode Buffer Layer]

The high-molecular weight compound for an anode buffer layer of the present invention comprises the above particular structural unit, and a structural unit derived from an electron-accepting compound having a polymerizable functional group (hereinafter, also referred to as an "electron-accepting structural unit").

The use of the high-molecular weight compound for an anode buffer layer for the formation of an anode buffer layer further lengthens the luminous life of the organic EL element.

(Particular Structural Unit)

Details of the above particular structural unit (e.g., a structure, preferable embodiments and a production method) are as described above.

(Electron-Accepting Structural Unit)

The electron-accepting structural unit is derived from an electron-accepting compound having a polymerizable functional group.

Examples of the electron-accepting compound having a polymerizable functional group include compounds obtained by substituting one hydrogen atom (or a fluorine atom, or a cyano group) of the electron-accepting compound listed above with a polymerizable functional group.

Examples of the polymerizable substituent include polymerizable substituents represented by the formulae (A1) to (A13) as described above.

(Other Structural Unit)

The high-molecular weight compound for an anode buffer layer may comprise the "other structural unit" as described above.

(High-Molecular Weight Compound for Anode Buffer Layer)

The high-molecular weight compound for an anode buffer layer comprises the electron-accepting structural unit in an amount of 0.1 to 20% by mol, preferably 0.5 to 10% by mol, more preferably 1 to 5% by mol, wherein the total amount of the high-molecular weight compound for an anode buffer layer is 100% by mol. When the content is within the above range, the anode buffer layer exhibits sufficient charge injection ability.

In view of the insolubilization of the anode buffer layer, preferably not less than 80% by mol, more preferably not less than 90% by mol, and still more preferably not less than 95% by mol of the residue is occupied by the above particular structural unit, wherein the amount of the residue (i.e., a total amount of structural units other than the electron-accepting structural unit in the high-molecular weight compound for an anode buffer layer) is 100% by mol.

In view of the insolubilization of the anode buffer layer, the high-molecular weight compound for an anode buffer layer usually has a weight average molecular weight as measured by GPC (gel permeation chromatography) of not less than 20,000, more preferably not less than 50,000, still more preferably 100,000. The upper limit is about 1,000,000 in view of the solubility of the high-molecular weight compound for a host itself. A value of the weight average molecular weight is a value measured by a measurement method in Examples described later.

The high-molecular weight compound for an anode buffer layer can be produced by an ordinary method in polymer production, except that the production employs, as a raw material, the monomer for deriving the above particular structural unit and the electron-accepting compound having a polymerizable functional group, and optionally employs the monomer for deriving the above other structural unit. The polymerization method may be any of radical polymerization, cation polymerization, anion polymerization and addition polymerization, and is preferably radial polymerization.

(Composition Comprising High-Molecular Weight Compound for Anode Buffer Layer)

The high-molecular weight compound for an anode buffer layer of the invention may be in the form of a composition containing other components.

Exemplary other components are the low-molecular weight compound for a host and the solvent as described above.

The low-molecular weight compound for a host is contained preferably in an amount of 3 to 20 parts by mass, more preferably 5 to 10 parts by mass, based on 100 parts by mass of the high-molecular weight compound for an anode buffer layer.

The content of the organic solvent in the composition can be arbitrarily determined in view of the thickness and the formation conditions of the anode buffer layer to be formed. As a guide, the organic solvent is prepared such that the content of solid components (a total amount of components excluding the organic solvent) in the composition is preferably 0.1 to 4% by mass, more preferably 0.4 to 2% by mass.

Organic EL Element and Production Method Thereof

The organic EL element of the invention comprises an anode, an anode buffer layer, a luminescent layer and a cathode that are laminated in this order. The anode buffer layer is formed by coating the anode with the composition for an anode buffer layer or the high-molecular weight compound for an anode buffer layer of the invention, and then heating the composition or the high-molecular weight compound.

Hereinafter, a structure of the organic EL element of the invention is described.

<1. Structure of Element>

FIG. 1 is a cross-sectional view showing an example of a structure of the organic EL element of the invention. Between an anode 2 and a cathode 5 which are provided on a transparent substrate 1, an anode buffer layer 3 and a luminescent layer 4 are laminated in order.

The structure of the organic EL element of the invention is not limited to the example of FIG. 1, and there can be mentioned an element structure in which (1) an anode buffer layer/a hole transport layer/a luminescent layer, (2) an anode buffer layer/a luminescent layer/an electron transport layer, (3) an anode buffer layer/a hole transport layer/a luminescent layer/an electron transport layer, (4) an anode buffer layer/a layer that contains a hole-transporting compound, a luminescent compound and an electron-transporting compound, (5) an anode buffer layer/a layer that contains a hole-transporting compound and a luminescent compound, (6) an anode buffer layer/a layer that contains a luminescent compound and an electron-transporting compound, (7) an anode buffer layer/a layer that contains a hole electron-transporting compound and a luminescent compound, or (8) an anode buffer layer/a luminescent layer/a hole block layer/an electron transport layer, is provided between the anode and the cathode in order. The number of the luminescent layer shown in FIG. 1 is one, but two or more luminescent layers may be provided.

In the present specification, a compound and a layer comprising all of, or one or more of an electron-transporting compound, a hole-transporting compound and a luminescent compound are also referred to as an "organic EL compound" and an "organic EL compound layer", respectively.

<2. Anode>

As the anode, preferred employable substances are those having a surface resistivity in the temperature range of −5 to 80° C. of not more than 1000Ω☐, more preferably not more than 100 Ω☐.

In the case where light is extracted from the anode side of the organic EL element (in the case of bottom emission), the anode needs to be transparent to visible light (average transmittance for the light of 380 to 680 nm: not less than 50%). In view of this, examples of a material for the anode are indium tin oxide (ITO) and indium zinc oxide (IZO). Of these, ITO is preferable, which is easy to obtain as a material for the anode of the organic EL element.

In the case where light is extracted from the cathode side of the organic EL element (in the case of top emission), light transmittance of the anode is not restricted, and employable examples of a material for the anode are ITO, IZO, stainless steel; a simple metal of copper, silver, gold, platinum, tungsten, titanium, tantalum or niobium; and an alloy of these metals.

In order to realize high light transmittance, the thickness of the anode is preferably 2 to 300 nm in the case of the bottom emission, and is preferably 2 nm to 2 mm in the case of the top emission.

<3. Anode Buffer Layer>

The anode buffer layer is formed by coating the anode with the composition for an anode buffer layer or the high-molecular weight compound for an anode buffer layer of the invention, and heating the composition or the high-molecular weight compound.

In the coating operation, known coating methods are employable, such as spin coating, casting, microgravure coating, gravure coating, bar coating, roll coating, wire bar coating, dip coating, spray coating, screen printing, flexography, offset printing and ink jet printing.

In the heating operation subsequent to the coating operation, the heating temperature is, as a guide, for example, 70° C. or higher, preferably 100 to 350° C., more preferably 150 to 250° C., in view of preventing the anode buffer layer from dissolving and preventing the anode buffer layer from being thermally decomposed during the formation of the organic EL compound layer as described later.

The heating time is preferably 10 to 180 minutes, more preferably 30 to 120 minutes in view of preventing the anode buffer layer from dissolving during the formation of the organic EL compound layer as described later.

The anode buffer layer formed by applying and heating the composition for an anode buffer layer or the high-molecular weight compound for an anode buffer layer of the invention has a high resistance against an organic solvent, and therefore, is difficult to dissolve even when this anode buffer layer is coated with a solution of a material for forming the luminescent layer and the like containing an organic solvent as a solvent. Thus, even when the solution of the material for forming the luminescent layer and the like used to form the luminescent layer and the like (e.g., the luminescent layer and the hole transport layer) on the anode buffer layer so as to be in contact with the anode buffer layer, contains the same solvent as the organic solvent contained in the composition for an anode buffer layer, the anode buffer layer hardly dissolves, and on the anode buffer layer, the luminescent layer and the like contacting with the anode buffer layer can be laminated by way of coating.

When the extent of the insolubilization of the anode buffer layer is evaluated, for example, based on a decrease rate of the thickness of the anode buffer layer subjected to the following treatment, i.e., (1−thickness after treatment/thickness before treatment)×100 [%], the decrease rate is, for example, not more than 30%, preferably not more than 10%, more preferably not more than 5%.

[Treatment]: A substrate (25 mm square, plate thickness: 1.1 mm, blue plate glass) having an anode buffer layer with a thickness of 20 nm provided on the surface is set in a spin coater. Then, 0.10 mL of toluene is dropped on the anode buffer layer. This is followed by rotation at 3,000 rpm for 30 seconds. This rotation is started within 5 seconds from the completion of the dropping of toluene. Thereafter, the anode buffer layer is allowed to stand under nitrogen atmosphere at 140° C. for 1 hour.

The thickness of the anode buffer layer is preferably 5 to 50 nm, more preferably 10 to 30 nm in terms of allowing the anode buffer layer to exhibit its effect as a buffer layer and preventing the increase in the driving voltage of the organic EL element.

<4. Organic EL Compound Layer>

In the organic EL element of the invention, for the organic EL compound layers, i.e., the luminescent layer, the hole transport layer and the electron transport layer, any of low-molecular weight compounds and high-molecular weight compounds are employable.

As organic EL compounds for forming the luminescent layer of the organic EL element of the invention, employable are luminescent low-molecular weight compounds and luminescent high-molecular weight compounds that are described in Yutaka Ohmori: Oyo Butsuri (Applied Physics), Vol. 70, No. 12, pp. 1419-1425 (2001). Of them, the luminescent high-molecular weight compounds are preferred in terms of being able to simplify an element preparation process, and phosphorescent compounds are preferred in terms of having high luminous efficiency. Therefore, phosphorescent high-molecular weight compounds are particularly preferred.

The luminescent high-molecular weight compounds can be classified into conjugated luminescent high-molecular weight compounds and non-conjugated luminescent high-molecular weight compounds. Of these, the non-conjugated luminescent high-molecular weight compounds are preferred.

From the above reasons, as the luminescent material employed in the invention, particularly preferred are phosphorescent non-conjugated high-molecular weight compounds (luminescent materials that are the phosphorescent high-molecular weight compounds and are the non-conjugated luminescent high-molecular weight compounds).

The luminescent layer in the organic EL element of the invention comprises at least a phosphorescent high-molecular weight compound preferably having, in one molecule, a phosphorescent unit that emits phosphorescence and a carrier transporting unit that transports a carrier. The phosphorescent high-molecular weight compound is obtained by copolymerizing a phosphorescent compound having a polymerizable substituent and a carrier transporting compound having a polymerizable substituent. The phosphorescent compound is a metal complex containing one metal element selected from iridium, platinum and gold, and above all, an iridium complex is preferred.

More specific examples of the phosphorescent high-molecular weight compound and the synthesis methods are disclosed in, for example, Patent Literatures JP-A-2003-342325, JP-A-2003-119179, JP-A-2003-113246, JP-A-2003-206320, JP-A-2003-147021, JP-A-2003-171391, JP-A-2004-346312 and JP-A-2005-97589.

The luminescent layer in the organic EL element produced by the process of the invention, preferably being a layer containing the phosphorescent compound, may contain a hole-transporting compound or an electron-transporting compound in order to compensate for the carrier transporting property of the luminescent layer. Examples of the hole-transporting compounds used for this purpose include low-molecular weight triphenylamine derivatives, such as TPD (N,N'-dimethyl-N,N'-(3-methylphenyl)-1,1'-biphenyl-4,4'-diamine), α-NPD (4,4'-bis[N-(1-naphthyl)-N-phenylamino]biphenyl) and m-MTDATA (4,4',4"-tris(3-methylphenylphenylamino)triphenylamine); polyvinylcarbazole; high-molecular weight compounds obtained by introducing polymerizable functional groups into the above triphenylamine derivatives and polymerizing them, such as high-molecular weight compounds of triphenylamine skeleton disclosed in JP-A-08-157575; polyparaphenylenevinylene; and polydialkylfluorene. As the electron-transporting compounds, employable are known electron-transporting compounds, e.g., low-molecular weight materials, such as quinolinol derivative metal complexes, specifically Alq3(tris(8-hydroxyquinolinato)aluminum (III)), oxadiazole derivatives, triazole derivatives, imidazole derivatives, triazine derivatives and triarylborane derivatives; and high-molecular weight compounds obtained by introducing polymerizable functional groups into the above low-molecular weight electron-transporting compounds and polymerizing them, such as poly PBD disclosed in JP-A-10-1665.

(Method for Forming Organic EL Compound Layer)

In the case where the organic EL compound is the luminescent high-molecular weight compound, the organic EL compound layer can be formed by coating method, such as spin coating, casting, microgravure coating, gravure coating, bar coating, roll coating, wire bar coating, dip coating, spray coating, screen printing, flexography, offset printing and ink jet printing.

As described above, the anode buffer layer formed from the composition for an anode buffer layer or the high-molecular weight compound for an anode buffer layer of the invention has a high resistance against an organic solvent, and therefore is difficult to dissolve even when the surface of the anode buffer layer is coated with the organic EL compound solution containing an organic solvent as a solvent.

On the other hand, in the case where the organic EL compound is the luminescent low-molecular weight compound, the organic EL compound layer can be formed mainly by resistance heating deposition method or electron beam deposition method.

<5. Hole Block Layer>

In order to inhibit the passing of holes through the luminescent layer and thereby efficiently recombining holes with electrons in the luminescent layer, a hole block layer may be provided adjacently to the cathode side of the luminescent layer. As the hole block layer, employable is a compound which has a deeper highest occupied molecular orbital (HOMO) level than that of the luminescent compound. Examples of such a compound include triazole derivatives, oxadiazole derivatives, phenanthroline derivatives and aluminum complexes.

Moreover, in order to prevent deactivation of exciton by a cathode metal, an exciton block layer may be provided adjacently to the cathode side of the luminescent layer. As the exciton block layer, employable is a compound having larger excitation triplet energy than that of the luminescent compound. Examples of such a compound include triazole derivatives, phenanthroline derivatives and aluminum complexes.

<6. Cathode>

As a material for the cathode of the organic EL element of the invention, employable is a material which has a low work function and which is chemically stable. Examples of such a material include known cathode materials, such as Al, an MgAg alloy and alloys of Al and alkali metals, specifically, AlLi and AlCa. In view of chemical stability, the work function is preferably not more than −2.9 eV. As a method for forming a film of such a cathode material, employable is resistance heating deposition method, electron beam deposition method, sputtering method, ion plating method or the like. The thickness of the cathode is preferably in the range of 10 nm to 1 μm, more preferably 50 to 500 nm.

In order to lower a barrier to the injection of electrons from the cathode to the organic layer thereby enhancing electron injection efficiency, a metal layer having a lower work function than that of the cathode may be interposed as a cathode buffer layer between the cathode and an organic layer adjacent to the cathode. Examples of metals with low work function employable for such purpose include alkali metals (Na, K, Rb, Cs), alkaline earth metals (Sr, Ba, Ca, Mg), and rare earth metals (Pr, Sm, Eu, Yb). Further, an alloy or a metal compound can be also used provided that it has a lower work function than that of the cathode. As a method for forming such a cathode buffer layer, deposition method, sputtering method or the like is employable. The thickness of the cathode buffer layer is preferably in the range of 0.05 to 50 nm, more preferably 0.1 to 20 nm, still more preferably 0.5 to 10 nm.

The cathode buffer layer may be formed from a mixture of the above substance having a low work function and an electron-transporting compound. As the electron-transporting compound employed herein, employable is the aforesaid organic compound used for the electron transport layer. As a film formation method in this case, a co-deposition method is employable. When the film formation by application of a solution is possible, the above-mentioned film formation methods are employable, such as spin coating, dip coating, ink jet method, printing, spraying and dispenser method. The thickness of the cathode buffer layer in this case is preferably in the range of 0.1 to 100 nm, more preferably 0.5 to 50 nm, still more preferably 1 to 20 nm. Between the cathode and the organic substance layer, there may be provided a layer formed from a conductive high-molecular weight compound, or a layer formed from a metal oxide, a metal fluoride, an organic insulating material or the like and having an average film thickness of not more than 2 nm.

<7. Sealing>

The preparation of the cathode may be followed by the provision of a protective layer for protecting the organic EL element. In order to stably use the organic EL element for a long period of time, the provision of the protective layer and/or a protective cover to externally protect the element is preferred. As the protective layer, employable examples are a high-molecular weight compound, a metal oxide, a metal fluoride, and a metal boride. As the protective cover, employable examples are a glass plate, a plastic plate with a surface having been subjected to treatment for lowering water permeability, and a metal. A preferable method is to laminate the cover onto the substrate of the element with a thermosetting resin or a photo-curing resin to seal the element. The use of a spacer to hold a space easily prevents the element from being damaged. Filling the space with an inert gas such as nitrogen or argon can prevent oxidation of the cathode, and furthermore, placing a desiccant such as barium oxide in the space easily prevents water adsorbed on the element during the production process from doing damage to the element. Taking one or more measures among these is preferred.

<8. Substrate>

As the substrate of the organic EL element of the invention, employable is a material which satisfies mechanical strength required for the organic EL element.

The organic EL element of bottom emission type employs a substrate transparent to visible light. Employable are, specifically, substrates made of glass, such as soda glass and no-alkali glass; a transparent plastic, such as an acrylic resin, a methacrylic resin, a polycarbonate resin, a polyester resin and a nylon resin; and silicon.

In addition to the substrates employable for the organic EL element of bottom emission type, the organic EL element of top emission type can employ substrates made of a simple metal of copper, silver, gold, platinum, tungsten, titanium, tantalum or niobium, an alloy of these metals, or stainless steel.

The thickness of the substrate is preferably 0.1 to 10 mm, more preferably 0.25 to 2 mm, though depending upon the mechanical strength required.

Uses

The organic EL element of the invention is favorably used as a picture element of a matrix system or a segment system in an image display apparatus. Further, the organic EL element is favorably used also as a surface emission light source without forming a picture element.

More specifically, the organic EL element of the invention is favorably used for display apparatus in, e.g., computers, televisions, portable terminals, cellular phones, car navigations, markings, signboards and view finders of video cameras, and for light irradiating apparatus e.g., back light, electrophotography, illumination, resist exposure light, reading apparatus, interior illumination and optical communication system.

EXAMPLES

Hereinafter, the present invention is further described with reference to the following examples, but it should be construed that the present invention is in no way limited to these examples.

[Measurement Method]
<Molecular Weight of High-Molecular Weight Compound for Host Etc.>

The weight-average molecular weight (in terms of styrene) and the molecular weight distribution index (Mw/Mn) of the high-molecular weight compound for a host were measured by gel permeation chromatography (GPC) under the following conditions.

Apparatus: Shodex GPC-101, manufactured by Showa Denko K.K.
Column: Shodex KF-G+KF804L+KF802+KF801
Eluting solution: tetrahydrofuran (THF)
Flow rate: 1 mL/min
Column temperature: 40° C.
<Decrease Rate of Thickness of Anode Buffer Layer>
(Preparation of Substrate with Anode Buffer Layer)

A substrate was coated with the composition for an anode buffer layer used in each Example and Comparative Example described later by spin coating method (conditions: 3,000 rpm, 30 seconds). The substrate was the same as a glass substrate constituting a glass substrate with an ITO film that was used in each Example and Comparative Example described later. The resulting coating film was allowed to stand under nitrogen atmosphere at 210° C. (80° C. for Example 3 alone) for 1 hour, thereby preparing a substrate (a) with an anode buffer layer. Furthermore, in a similar manner, a substrate (b) with an anode buffer layer was prepared.

(Measurement of Thickness of Anode Buffer Layer)

Figure 2:
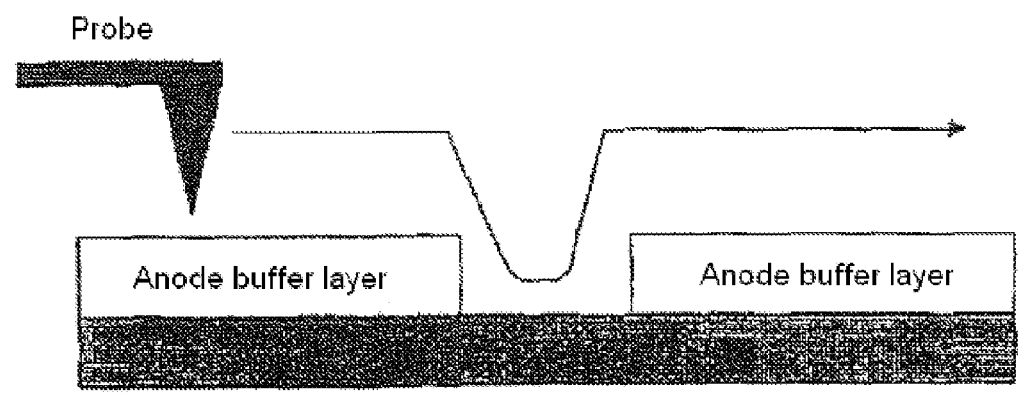
FIG. 2 schematically shows a method for measuring the thickness of an anode buffer layer in Example.

Part of the anode buffer layer of the substrate (a) with the anode buffer layer was scratched with a needle so as to expose the substrate (a substrate surface thus exposed is also referred to as a "substrate exposed portion"). Using an AFM (atomic force microscope), a surface at the anode buffer layer side of the substrate (a) with the anode buffer layer was observed in such a manner that the substrate exposed portion was traversed as shown in FIG. 2, thereby measuring the thickness of the anode buffer layer (hereinafter, also referred to as an "anode buffer layer before dissolution test treatment").

(Calculation of Decrease Rate)

The anode buffer layer of the substrate (b) with the anode buffer layer was subjected to dissolution test treatment as described below.

[Dissolution Test Treatment]:

On the anode buffer layer, 0.10 mL of an organic solvent was dropped, and then, the specimen was rotated at 3,000 rpm for 30 seconds. This rotation was started within 5 seconds from the completion of the dropping of the organic solvent. Thereafter, the specimen was allowed to stand under nitrogen atmosphere at 140° C. for 1 hour. In Examples 1-(a) to (c), 2, 3, 4-(a) to (c), and Comparative Examples 1 to 3, toluene was used. In Examples 5-(a) to (d) and 6, and Comparative Examples 4-(a) to (c) and 5, xylene was used.

Then, the thickness of the anode buffer layer of the substrate (b) with the anode buffer layer (hereinafter, also referred to as an "anode buffer layer after dissolution test treatment") was measured in the same manner as in the substrate (a) with the anode buffer layer, and a "decrease rate (%)" of the thickness of the anode buffer layer defined in the following formula was calculated.

Decrease rate=(1−thickness of anode buffer layer after dissolution test treatment/thickness of anode buffer layer before dissolution test treatment)×100

Synthesis Example 1

Synthesis of pHMTPD

A compound represented by the following formula (hereinafter, also referred to as "viHMTPD") was synthesized in accordance with the method as described in JP-A-2005-200638 ([0112]).

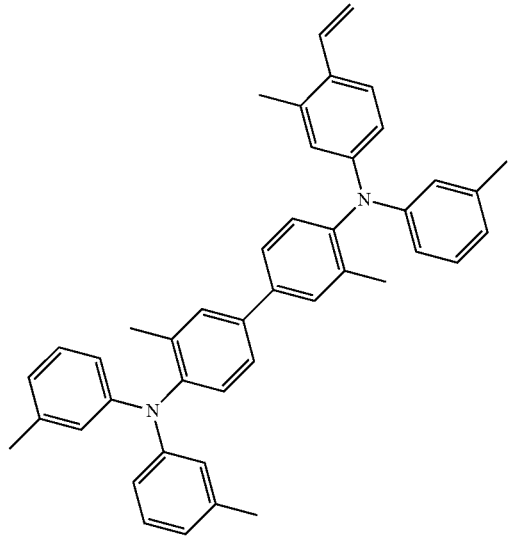

(viHMTPD)

Into a sealed vessel, viHMTPD (500 mg) was introduced, and dehydrated toluene (9.9 mL) was added, and then a toluene solution (0.1M, 198 μL) of a polymerization initiator (product name: V-601, manufactured by Wako Pure Chemical Industries, Ltd.) was added. After repeating freeze deaeration operation five times, these were vacuum sealed, and stirred at 60° C. for 60 hours, thereby being reacted. The reaction liquid was dropped in 500 mL of acetone to obtain a precipitate. After repeating re-precipitation purification operation with toluene-acetone two times, the precipitate was vacuum dried at 50° C. overnight, thereby obtaining a high-molecular weight compound for a host (pHMTPD). The high-molecular weight compound for a host (pHMTPD) had a weight average molecular weight of 68,000, and had a molecular weight distribution index (Mw/Mn) of 1.96.

Synthesis Example 2

Synthesis of pHMTPD-2

The same operation was carried out as in Synthesis Example 1, except that the concentration of the toluene solution of the polymerization initiator (product name: V-601) was 0.2 M, thereby obtaining a high-molecular weight compound for a host (pHMTPD-2). The high-molecular weight compound for a host (pHMTPD-2) had a weight average molecular weight of 22,000, and had a molecular weight distribution index (Mw/Mn) of 1.86.

Synthesis Example 3

Synthesis of pTmTDMPD

Synthesis of N,N,N'-tri-m-tolyl-2,5-dimethyl-1,4-phenylenediamine

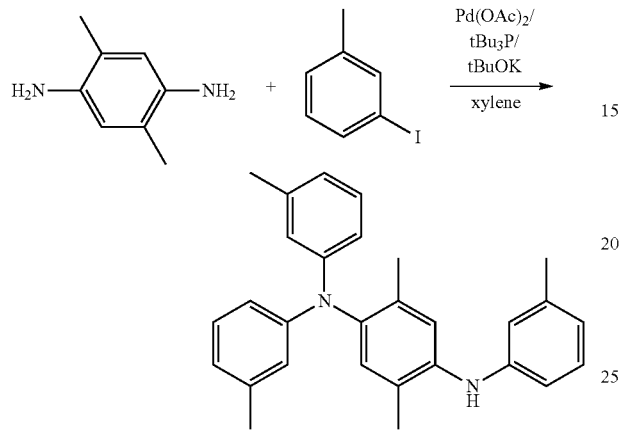

Into 100 mL three-necked flask with a condenser tube, 2,5-dimethyl-1,4-phenylenediamine (1.362 g (10 mmol)) was introduced, and the flask was purged with nitrogen. Into the flask, dehydrated xylene (60 mL) and 3-iodotoluene (5.233 g (24 mmol)) were added, and the mixture was stirred. Then, palladium acetate (337 mg (1.5 mmol)), potassium-t-butoxide (4.040 g (36 mmol)), a solution of tri-t-butylphosphine:xylene=1:1 (1.8 mL (4.5 mmol)) were added, and the mixture was refluxed for 2 hours. Then, 3-iodotoluene (1.308 g (6 mmol)) was added, and the mixture was refluxed for 2 hours, and further, 3-iodotoluene (1.308 g (6 mmol)) was added, and the mixture was refluxed for 3 hours.

After the reaction, the mixture was cooled to room temperature, and was subjected to Celite filtration using a dichloromethane solvent. From the filtrate, the solvent was evaporated under reduced pressure, and the resulting residue was purified by silica gel column chromatography (hexane:toluene=1:1), thereby obtaining 1.88 g of N,N,N'tri-m-tolyl-2,5-dimethyl-1,4-phenylenediamine (yield: 46%).

Synthesis of vTmDMPD

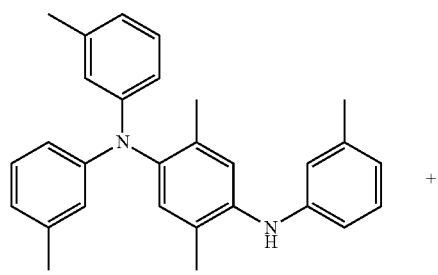

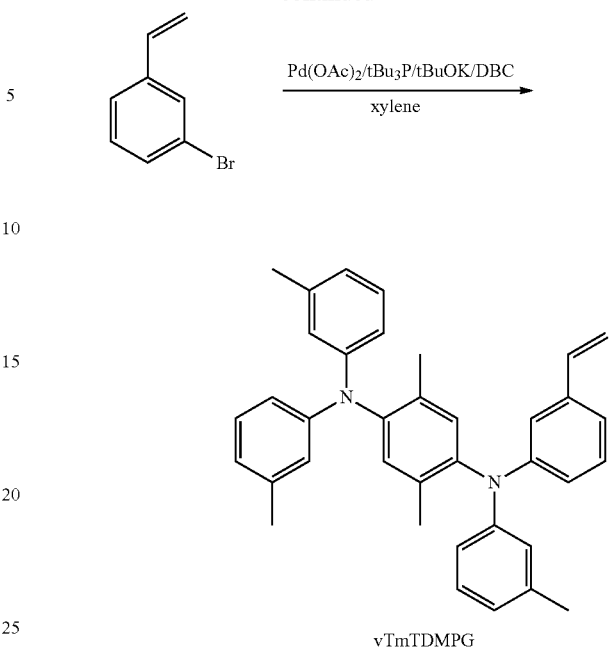

Into 50 mL three-necked flask with a condenser tube, N,N,N'-tri-m-tolyl-2,5-dimethyl-1,4-phenylenediamine (610 mg (1.5 mmol)) and 2,6-di-t-butyl-p-cresol (DBC) (20 mg) were introduced, and the flask was purged with nitrogen. Into the flask, 3-bromostyrene (366 mg (2 mmol)), dehydrated xylene (20 mL), palladium acetate (23 mg (0.1 mmol)), potassium-t-butoxide (191 mg (1.7 mmol)), and a solution of tri-t-butylphosphine:xylene=1:1 (0.12 mL (0.3 mmol)) were added. With stirring, the mixture was refluxed for 6 hours.

After the reaction, the mixture was cooled to room temperature, and was subjected to Celite filtration using a dichloromethane solvent. From the filtrate, the solvent was evaporated under reduced pressure, and the resulting residue was purified by silica gel column chromatography (hexane:chloroform=100:0→48:52), thereby obtaining a purified product. The purified product was recrystallized with dichloromethane-methanol, thereby obtaining 640 mg of vTmTDMPD, which was an intended product (yield: 84%).

Synthesis of pTmTDMPD

Into a sealed vessel, vTmTDMPD (500 mg) was introduced, and dehydrated toluene (5.0 mL) was added, and then a toluene solution (0.1 M, 50 μL) of a polymerization initiator (product name: V-601, manufactured by Wako Pure Chemical Industries, Ltd.) was added. A subsequent operation was carried out in the same manner as in Synthesis Example 1, thereby obtaining a high-molecular weight compound for a host (pTmTDMPD). The high-molecular weight compound for a host (pTmTDMPD) had a weight average molecular weight of 110,000, and had a molecular weight distribution index (Mw/Mn) of 2.23.

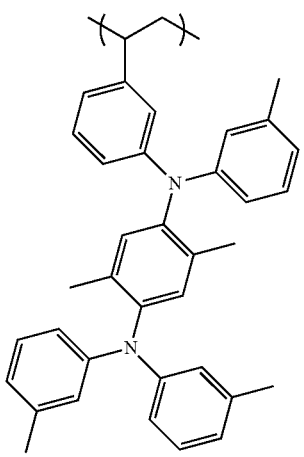

Synthesis Example 4

Synthesis of pHMTPD-TPD

Into a sealed vessel, viHMTPD (475 mg), and viTPD (25 mg) obtained in Synthesis Example 5 described later were introduced, and dehydrated toluene (5.0 mL) was added, and then a toluene solution (0.1 M, 50 µL) of a polymerization initiator (product name: V-601, manufactured by Wako Pure Chemical Industries, Ltd.) was added. A subsequent operation was carried out in the same manner as in Synthesis Example 1, thereby obtaining a high-molecular weight compound for a host (pHMTPD-TPD). The high-molecular weight compound for a host (pHMTPD-TPD) had a weight average molecular weight of 100,000, had a molecular weight distribution index (Mw/Mn) of 2.30, and had a molar ratio such that a structural unit derived from viHMTPD:a structural unit derived from viTPD=94:6.

Synthesis Example 5

Synthesis of pTPD

A monomer (viTPD, a mixture of compounds represented by the following formulae) was synthesized in accordance with the method as described in JP-A-2005-97589 (Example 1).

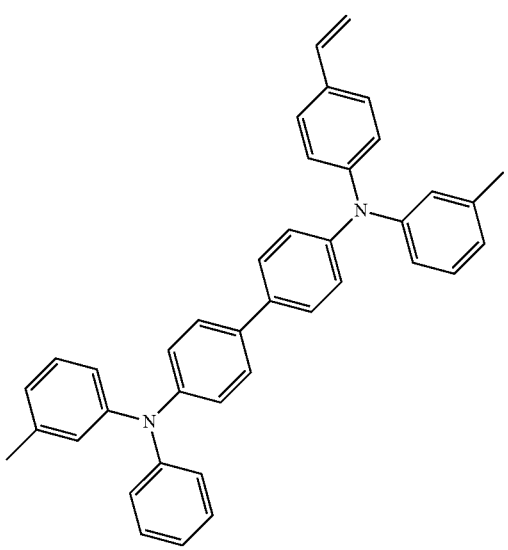

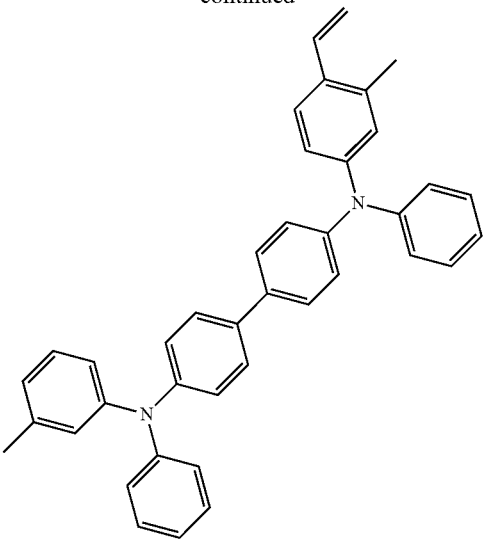

Polymerization and purification were carried out in the same manner as in Synthesis Example 1, except that viHMTPD (500 mg) was replaced with viTPD (450 mg), thereby obtaining a high-molecular weight compound for a host (pTPD). The high-molecular weight compound for a host (pTPD) had a weight average molecular weight of 64,000, and had a molecular weight distribution index (Mw/Mn) of 1.87.

Synthesis Example 6

Synthesis of pHMTPD-3

The same operation was carried out as in Synthesis Example 1, except that the concentration of the toluene solution of the polymerization initiator (product name: V-601) was 0.5 M, thereby obtaining a high-molecular weight compound for a host (pHMTPD-3). The high-molecular weight compound for a host (pHMTPD-3) had a weight average molecular weight of 10,000, and had a molecular weight distribution index (Mw/Mn) of 1.80.

Synthesis Example 7

Synthesis of pHMTPD-pPhTCNQ

Synthesis of vipPhTCNQ

Into TCNQ, which is an electron-accepting compound, a polymerizable substituent was introduced by a method as described below, thereby obtaining vipPhTCNQ, which is an electron-accepting compound having a polymerizable substituent.

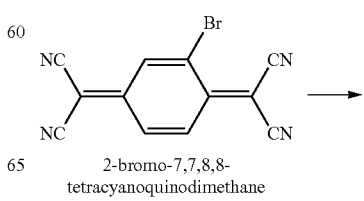

2-bromo-7,7,8,8-tetracyanoquinodimethane

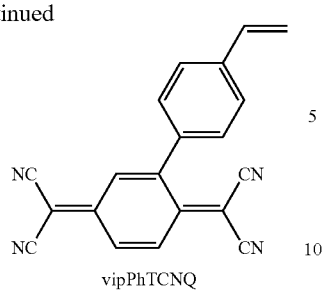
vipPhTCNQ 2-bromo-7,7,8,8-tetracyanoquinodimethane, which was a starting material, was synthesized in accordance with the method as described in a literature (Chemistry Letters, pp. 689-690, 1985).

Into 100 mL three-necked flask with a thermometer and a reflux condenser, 2-bromo-7,7,8,8-tetracyanoquinodimethane (2.83 g (10.0 mmol)), p-vinylphenyl boric acid (1.63 g (11.00 mmol)), potassium carbonate (4.15 g (30.0 mmol)), toluene (20 mL), diethoxyethane (20 mL), and water (20 mL) were added, and the mixture was stirred under nitrogen flowing at 110° C. for 1 hour. Into this reaction mixture, tetrakis(triphenylphosphine)palladium (0) (580 mg (0.50 mmol)) was added, and the mixture was stirred under nitrogen flowing at 110° C. for 4 hours. After the reaction, an insoluble substance was filtered off, and the filtrate was subjected to liquid separation operation, thereby extracting an organic layer and the organic layer was concentrated. The residue was purified by silica gel column chromatography (developing solvent: hexane/dichloromethane=10/90), thereby obtaining 2.45 g of vipPhTCNQ.

Synthesis of pHMTPD-pPhTCNQ

Polymerization operation was carried out in the same manner as in Synthesis Example 4, except for using viH-MTPD synthesized in Synthesis Example 1 (100 parts by mass) and the above vipPhTCNQ (5 parts by mass) as a raw material, thereby synthesizing a compound for an anode buffer layer (pHMTPD-pPhTCNQ, hereinafter also referred to as a "high-molecular weight compound for an anode buffer layer 1"). The high-molecular weight compound for an anode buffer layer 1 had a weight average molecular weight of 69,000, had a molecular weight distribution index (Mw/Mn) of 2.45, and had a molar ratio such that a structural unit derived from viHMTPD:a structural unit derived from vipPhTCNQ=96:4.

Synthesis Example 8

Synthesis of pHMTPD-pPhF3TCNQ

Synthesis of vipPhF3TCNQ

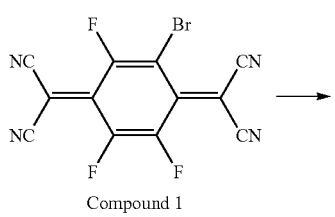
Compound 1

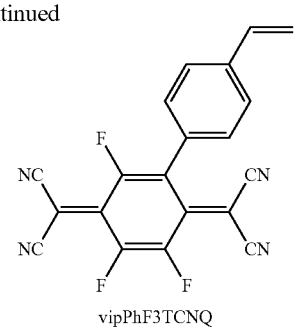
vipPhF3TCNQ

The same operation was carried out as in the synthesis of vipPhTCNQ in Synthesis Example 7, except for using 1.77 g of a compound 1 instead of 2-bromo-7,7,8,8-tetracyanoquinodimethane, as a starting material, thereby synthesizing 1.51 g of vipPhF3TCNQ.

Synthesis of pHMTPD-pPhF3TCNQ

Polymerization operation was carried out in the same manner as in Synthesis Example 4, except for using viH-MTPD synthesized in Synthesis Example 1 (100 parts by mass) and the above vipPhF3TCNQ (5 parts by mass) as a raw material, thereby synthesizing a compound for an anode buffer layer (pHMTPD-pPhF3TCNQ, hereinafter also referred to as a "high-molecular weight compound for an anode buffer layer 2"). The high-molecular weight compound for an anode buffer layer 2 had a weight average molecular weight of 67,000, had a molecular weight distribution index (Mw/Mn) of 2.47, and had a molar ratio such that a structural unit derived from viHMTPD:a structural unit derived from vipPhF3TCNQ=95:5.

Synthesis Example 9

Synthesis of pHMTPD-pPhDCNQI

Synthesis of vipPhDCNQI

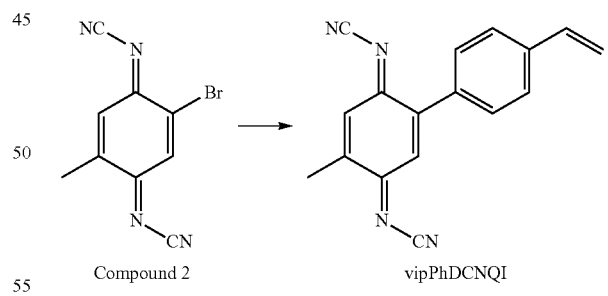
Compound 2                vipPhDCNQI

The same operation was carried out as in the synthesis of vipPhTCNQ in Synthesis Example 7, except for using 1.77 g of a compound 2 instead of 2-bromo-7,7,8,8-tetracyanoquinodimethane, as a starting material, thereby synthesizing 479 mg (1.76 mmol) of vipPhDCNQI.

Synthesis of pHMTPD-pPhDCNQI

Polymerization operation was carried out in the same manner as in Synthesis Example 4, except for using viH-MTPD synthesized in Synthesis Example 1 (100 parts by mass) and the above vipPhDCNQI (5 parts by mass) as a raw material, thereby synthesizing a compound for an anode buffer layer (pHMTPD-pPhDCNQI, hereinafter also referred to as a "high-molecular weight compound for an anode buffer layer 3"). The high-molecular weight compound for an anode buffer layer 3 had a weight average molecular weight of 66,000, had a molecular weight distribution index (Mw/Mn) of 2.38, and had a molar ratio such that a structural unit derived from viHMTPD:a structural unit derived from vipPhDCNQ=95:5.

Synthesis Example 10

Synthesis of pMPDA

Synthesis of Compound 3

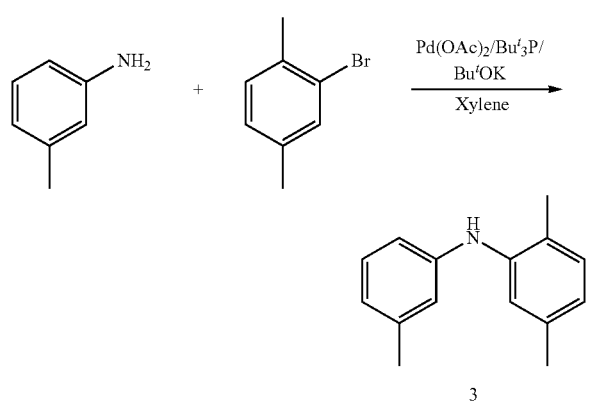

Into 100 mL three-necked flask with a condenser tube, 2.0 g of o-toluidine (19 mmol) was introduced, and the flask was purged with nitrogen. Into the flask, dehydrated xylene (60 mL) and 2-bromo-p-xylene (3.5 g (19 mmol)) were added, and the mixture was stirred. Then, palladium acetate (0.35 g (1.6 mmol)), potassium-t-butoxide (4.0 g (36 mmol)), a solution of tri-t-butylphosphine:xylene=1:1 (1.8 mL (4.5 mmol)) were added, and the mixture was heated and refluxed for 2 hours. Then, the resulting reaction mixture was cooled to room temperature, and was subjected to Celite filtration using a dichloromethane solvent. From the filtrate, the solvent was evaporated under reduced pressure, and the resulting residue was purified by silica gel column chromatography (hexane:toluene=1:1), thereby obtaining 3.1 g (15 mmol) of a compound 3 (yield: 80%).

Synthesis of vMPDA

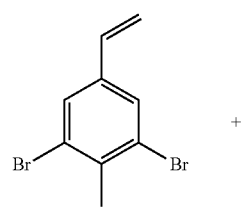

+

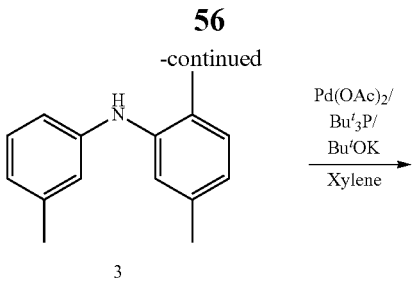

Into 100 mL three-necked flask with a condenser tube, 3,5-dibromo-4-methylstyrene (1.0 g (3.6 mmol)) was introduced, and the flask was purged with nitrogen. Into the flask, dehydrated xylene (60 mL) and the compound 3 (3.1 g (15 mmol)) were added, and the mixture was stirred. Then, palladium acetate (0.35 g (1.6 mmol)), potassium-t-butoxide (4.0 g (36 mmol)), a solution of tri-t-butylphosphine:xylene=1:1 (1.8 mL (4.5 mmol)) were added, and the mixture was heated and refluxed for 4 hours. Then, the resulting reaction mixture 5. was cooled to room temperature, and was subjected to Celite filtration using a dichloromethane solvent. From the filtrate, the solvent was evaporated under reduced pressure, and the resulting residue was purified by silica gel column chromatography (hexane:toluene=4:1), and the purified product was recrystallized with dichloromethane-methanol, thereby obtaining 1.8 g (3.4 mmol) of vMPDA (yield: 95%).

Identification data of vMPDA is as follows.

Elemental analysis:

calculated value ($C_{39}H_{40}N_2$) C, 87.27; H, 7.51; N, 5.22 measured value C, 87.77; H, 7.60; N, 4.99

Mass analysis (FAB+): 536 (M+)

Synthesis of pMPDA

Into a sealed vessel, vMPDA (500 mg) was introduced, and dehydrated toluene (5.0 mL) was added, and then a toluene solution (0.1M, 50 μL) of a polymerization initiator (product name: V-601, manufactured by Wako Pure Chemical Industries, Ltd.) was added. A subsequent operation was carried out in the same manner as in Synthesis Example 1, thereby obtaining a high-molecular weight compound for a host (pMPDA). The high-molecular weight compound for a host (pMPDA) had a weight average molecular weight of 95,000, and had a molecular weight distribution index (Mw/Mn) of 2.30.

Synthesis Example 11

Synthesis of pMPDAA

Synthesis of Compound 4

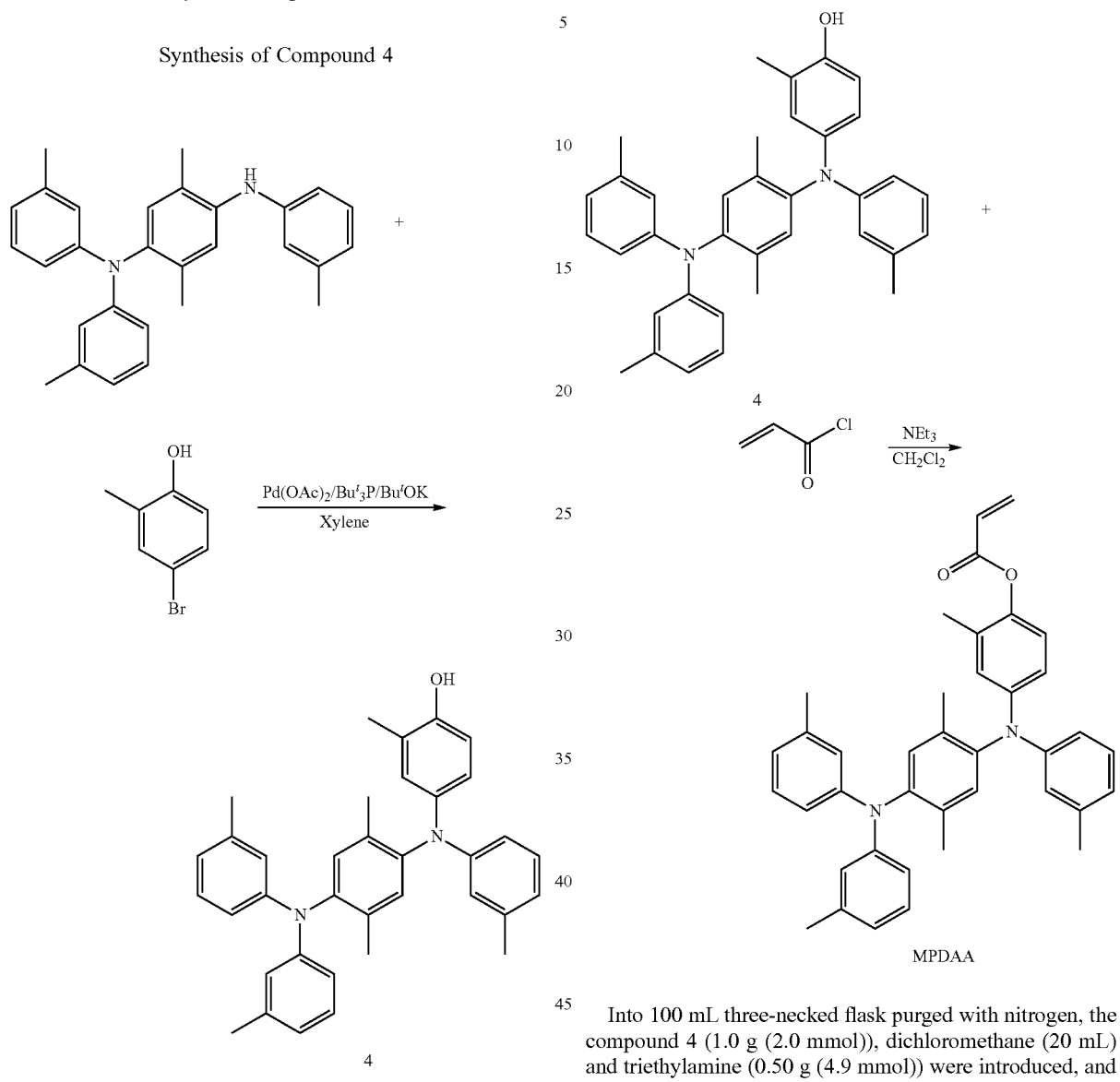

Synthesis of MPDAA

Into 100 mL three-necked flask with a condenser tube, N,N,N'-tri-m-tolyl-2,5-dimethyl-1,4-phenylenediamine obtained in Synthesis Example 3 (2.0 g (4.9 mmol)) was introduced, and the flask was purged with nitrogen. Into the flask, dehydrated xylene (60 mL) and 4-bromo-2-methyl-phenol (1.5 g (8.0 mmol)) were added, and the mixture was stirred. Then, palladium acetate (0.35 g (1.6 mmol)), potassium-t-butoxide (4.0 g (36 mmol)), and a solution of tri-t-butylphosphine:xylene=1:1 (1.8 mL (4.5 mmol)) were added, and the mixture was heated and refluxed for 6 hours. Then, the resulting reaction mixture was cooled to room temperature, and was subjected to Celite filtration using a dichloromethane solvent. From the filtrate, the solvent was evaporated under reduced pressure, and the resulting residue was purified by silica gel column chromatography (toluene:dichloromethane=1:1), thereby obtaining 1.0 g (2.0 mmol) of a compound 4 (yield: 40%).

Into 100 mL three-necked flask purged with nitrogen, the compound 4 (1.0 g (2.0 mmol)), dichloromethane (20 mL) and triethylamine (0.50 g (4.9 mmol)) were introduced, and the flask was put in an ice bath to cool the solution. Into this solution, acryloyl chloride (0.30 g (3.3 mmol)) was added little by little, and the mixture was stirred at room temperature for 1 hour. From the resulting reaction mixture, the solvent was evaporated under reduced pressure, and the residue was purified by silica gel column chromatography (hexane:toluene=1:1), thereby obtaining 1.0 g (1.8 mmol) of MPDAA (yield: 900).

Identification data of MPDAA is as follows.
Elemental analysis:
calculated value ($C_{39}H_{38}N_2O_2$) C, 82.65; H, 6.76; N, 4.94
measured value C, 82.53; H, 6.81; N, 5.08
Mass analysis (FAB+): 566 ($M^+$)

Synthesis of pMPDAA

Into a sealed vessel, MPDAA (500 mg) was introduced, and dehydrated toluene (5.0 mL) was added, and then a toluene solution (0.1 M, 50 μL) of a polymerization initiator (product name: V-601, manufactured by Wako Pure Chemical Industries, Ltd.) was added. A subsequent operation was carried out in the same manner as in Synthesis Example 1, thereby obtaining a high-molecular weight compound for a host (pMPDAA). The high-molecular weight compound for a host (pMPDAA) had a weight average molecular weight of 67,000, and had a molecular weight distribution index (Mw/Mn) of 2.25.

Synthesis Example 12

Synthesis of pMPDAB

Synthesis of MPDAB

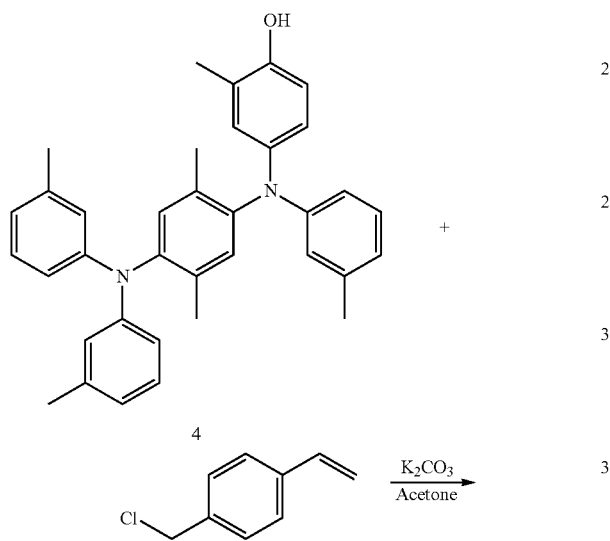

Into 100 mL three-necked flask with a condenser tube, the compound 4 obtained in Synthesis Example 11 (1.0 g (2.0 mmol)) was introduced, and the flask was purged with nitrogen. Into the flask, dehydrated acetone (25 mL) and 4-vinylbenzyl chloride (0.50 g (3.3 mmol)) were added, and the mixture was stirred. Then, potassium carbonate (2.0 g (14 mmol)) was added, and the mixture was heated and refluxed for 8 hours. Then, the resulting reaction mixture was cooled to room temperature, and was subjected to Celite filtration. From the filtrate, the solvent was evaporated under reduced pressure, and the resulting residue was purified by silica gel column chromatography (hexane:toluene=2:1). The purified product was recrystallized with dichloromethane-methanol, thereby obtaining 1.0 g (1.6 mmol) of MPDAB (yield: 800).

Identification data of MPDAB is as follows.

Elemental analysis:

calculated value ($C_{45}H_{44}N_2O$) C, 85.95; H, 7.05; N, 4.45 measured value C, 86.37; H, 7.40; N, 4.16

Mass analysis (FAB+): 628 ($M^+$)

Synthesis of pMPDAB

Into a sealed vessel, MPDAB (500 mg) was introduced, and dehydrated toluene (5.0 mL) was added, and then a toluene solution (0.1 M, 50 μL) of a polymerization initiator (product name: V-601, manufactured by Wako Pure Chemical Industries, Ltd.) was added. A subsequent operation was carried out in the same manner as in Synthesis Example 1, thereby obtaining a high-molecular weight compound for a host (pMPDAB). The high-molecular weight compound for a host (pMPDAB) had a weight average molecular weight of 95,000, and had a molecular weight distribution index (Mw/Mn) of 2.41.

Synthesis Example 13

Synthesis of pDBDMPD

Synthesis of Compound 5

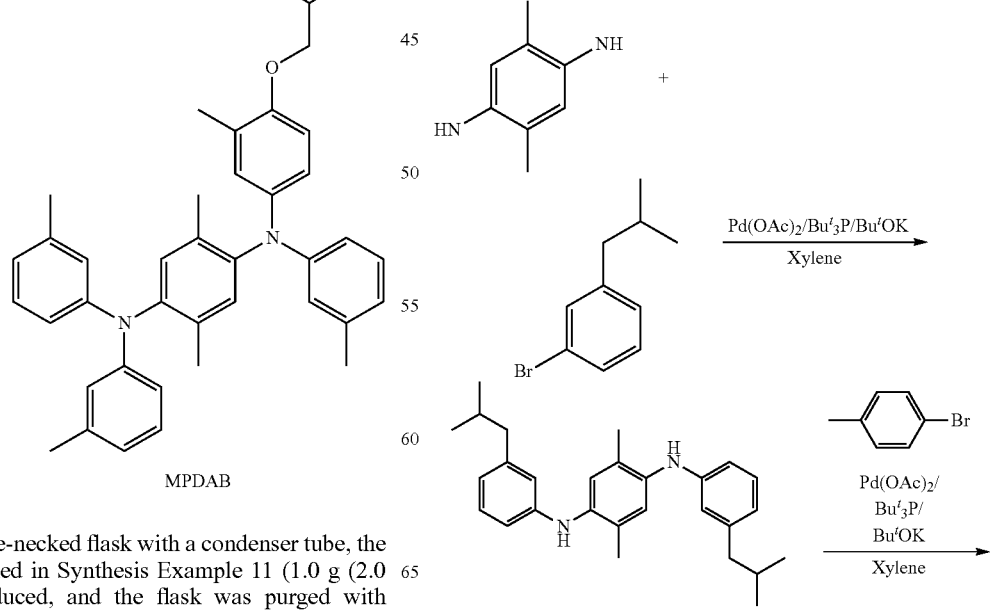

-continued

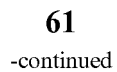

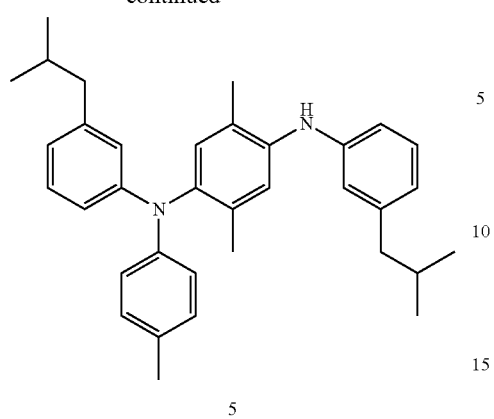

5

-continued

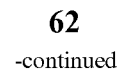

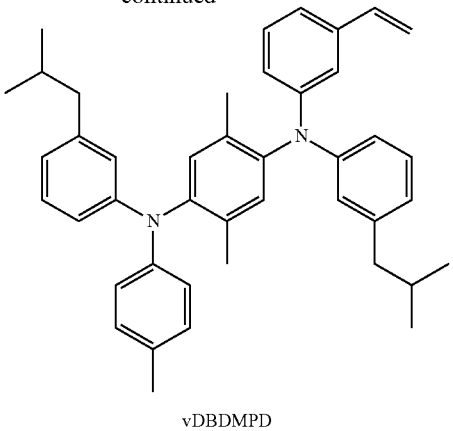

vDBDMPD

Into 100 mL three-necked flask with a condenser tube, 2,5-dimethyl-1,4-phenylenediamine (2.0 g (15 mmol)) was introduced, and the flask was purged with nitrogen. Into the flask, dehydrated xylene (60 mL) and 3-bromo-(2-methyl-propyl)benzene (6.0 g (28 mmol)) were added and the mixture was stirred. Then, palladium acetate (0.35 g (1.6 mmol)), potassium-t-butoxide (4.0 g (36 mmol)), a solution of tri-t-butylphosphine:xylene=1:1 (1.8 mL (4.5 mmol)) were added, and the mixture was heated and refluxed for 2 hours. Then, 4-bromotoluene (2.5 g (15 mmol)) was further added, and the mixture was heated and refluxed for 2 hours. The resulting reaction mixture was cooled to room temperature, and was subjected to Celite filtration using a dichloromethane solvent. From the filtrate, the solvent was evaporated under reduced pressure, and the resulting residue was purified by silica gel column chromatography (hexane:toluene=1:1), thereby obtaining 3.5 g (7.1 mmol) of a compound 5 (yield: 50%).

Synthesis of vDBDMPD

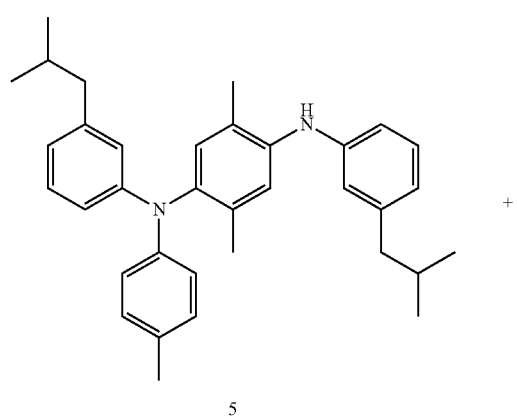

Into 100 mL three-necked flask with a condenser tube, the compound 5 (3.5 g (7.1 mmol)) was introduced, and the flask was purged with nitrogen. Into the flask, 3-bromostyrene (2.0 g (11 mmol)), dehydrated xylene (60 mL), palladium acetate (0.35 g (1.6 mmol)), potassium-t-butoxide (4.0 g (36 mmol)), and a solution of tri-t-butylphosphine:xylene=1:1 (1.8 mL (4.5 mmol)) were added, and the mixture was heated and refluxed for 2 hours. Then, the resulting reaction mixture was cooled to room temperature, and was subjected to Celite filtration. From the filtrate, the solvent was evaporated under reduced pressure, and the resulting residue was purified by silica gel column chromatography (hexane:toluene=5:1), and the purified product was recrystallized with dichloromethane-methanol, thereby obtaining 3.0 g (5.1 mmol) of vDBDMPD (yield: 70%).

Identification data of vDBDMPD is as follows.

Elemental analysis:
calculated value ($C_{43}H_{48}N_2$) C, 87.11; H, 8.16; N, 4.73
measured value C, 86.79; H, 8.26; N, 4.91
Mass analysis (FAB+): 592 ($M^+$)

Synthesis of pDBDMPD

Into a sealed vessel, vDBDMPD (500 mg) was introduced, and dehydrated toluene (5.0 mL) was added, and then a toluene solution (0.1 M, 50 μL) of a polymerization initiator (product name: V-601, manufactured by Wako Pure Chemical Industries, Ltd.) was added. A subsequent operation was carried out in the same manner as in Synthesis Example 1, thereby obtaining a high-molecular weight compound for a host (pDBDMPD). The high-molecular weight compound for a host (pDBDMPD) had a weight average molecular weight of 170,000, and had a molecular weight distribution index (Mw/Mn) of 2.06.

Example 1-(a)

Preparation of Composition for Anode Buffer Layer pHMTPD produced in Synthesis Example 1 (100 parts by mass), which is a charge-transporting polymer, F4TCNQ (5 parts by mass), which is an electron-accepting compound, and toluene were mixed, thereby preparing a composition for an anode buffer layer (a toluene solution having a solid component concentration of 0.8% by mass, hereinafter, also referred to as a "composition for an anode buffer layer 1").

Production of Organic EL Element

A glass substrate with an ITO film was coated with the composition for an anode buffer layer 1 by spin coating method (conditions: 3,000 rpm, 30 seconds). The resulting coating film was allowed to stand under nitrogen atmosphere at 210° C. for 1 hour, thereby forming an anode buffer layer.

The substrate with the anode buffer layer was allowed to sufficiently cool at room temperature. Then, a surface at the anode buffer layer side was coated by spin coating method with a toluene solution (also referred to as a "coating solution for luminescent layer 1") of a material for a luminescent layer (mixed powders of 95% by mass of a copolymer of a compound represented by the following formula (E-1) and a compound represented by the following formula (E-2) (molar ratio: 5:5), which copolymers are carrier-transporting compounds, and 5% by mass of a compound represented by the following formula (E-3), which is a phosphorescent compound). Then, the resulting coating film was allowed to stand under nitrogen atmosphere at 140° C. for 1 hour, thereby forming a luminescent layer. Using a vacuum deposition apparatus, on a surface of the luminescent layer, a LiF layer with a thickness of 0.5 nm serving as a cathode buffer layer was formed, and subsequently, an Al layer with a thickness of 150 nm serving as a cathode was formed. Thereby, an organic EL element (hereafter, also referred to as an "organic EL element 1") was produced.

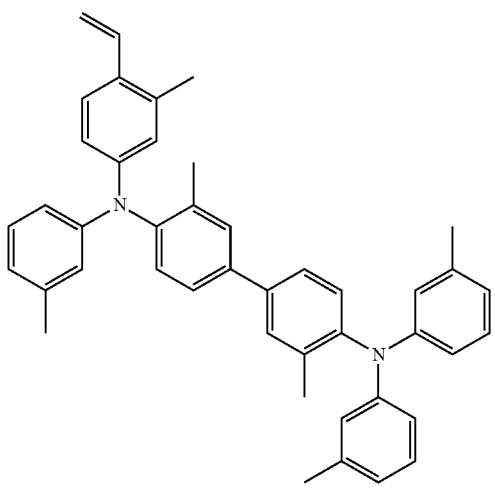

E-1

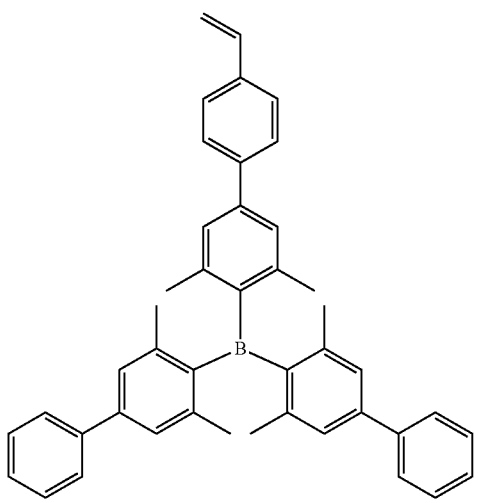

E-2

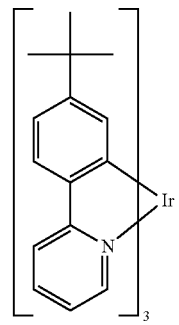

E-3

To the organic EL element 1, voltage was applied step by step with a power supply (SM2400, manufactured by Keithley Instruments Inc.), and a luminance of the organic EL element 1 was measured with a luminance meter (BM-9, manufactured by TOPCON Corporation). The luminous efficiency was determined from a ratio of a luminance to a current density. The luminous efficiency, the driving voltage and the electrical power efficiency are shown in Table 1.

Furthermore, the application of a constant electric current to the organic EL element 1 with the same apparatus was continued, and the luminance was measured every prescribed period of time to measure the luminous life. Table 1 shows the time taken until an initial luminance was reduced by half.

Example 1-(b)

The same operation was carried out as in Example 1-(a), except that pHMTPD was replaced with pHMTPD-2 produced in Synthesis Example 2, thereby preparing a composition for an anode buffer layer 2 and producing an organic EL element (hereinafter, also referred to as an "organic EL element 2"). The total thickness of the anode buffer layer and the luminescent layer of the organic EL element 2, and the luminous efficiency thereof and the like are shown in Table 1.

Example 1-(c)

The same operation was carried out as in Example 1-(a), except that pHMTPD was replaced with pTmTDMPD produced in Synthesis Example 3, thereby preparing a composition for an anode buffer layer 3 and producing an organic EL element (hereinafter, also referred to as an "organic EL element 3"). The total thickness of the anode buffer layer and the luminescent layer of the organic EL element 3, and the luminous efficiency thereof and the like are shown in Table 1.

Example 2

The same operation was carried out as in Example 1-(a), except that pHMTPD was replaced with pHMTPD-TPD produced in Synthesis Example 4, thereby preparing a composition for an anode buffer layer 4 and producing an organic EL element (hereinafter, also referred to as an "organic EL element 4"). The total thickness of the anode buffer layer and the luminescent layer of the organic EL element 4, and the luminous efficiency thereof and the like are shown in Table 1.

Example 3

The same operation was carried out as in Example 1, except that a glass substrate with an ITO film was coated with the composition for an anode buffer layer 1 by spin coating method (3,000 rpm, 30 seconds), and the resulting coating film was allowed to stand under nitrogen atmosphere at 80° C. for 1 hour thereby forming an anode buffer layer. Thereby, an organic EL element (hereinafter, also referred to as an "organic EL element 5") was produced. The total thickness of the anode buffer layer and the luminescent layer of the organic EL element 5, and the luminous efficiency thereof and the like are shown in Table 1.

Comparative Example 1

The same operation was carried out as in Example 1-(a), except that pHMTPD was replaced with pTPD produced in Synthesis Example 5, thereby preparing a composition for an anode buffer layer 5 and producing an organic EL element (hereinafter, also referred to as an "organic EL element 6"). The total thickness of the anode buffer layer and the luminescent layer of the organic EL element 6, and the luminous efficiency thereof and the like are shown in Table 1.

In the organic EL element 6, the total thickness of the anode buffer layer and the luminescent layer was thinner than that in any of the organic EL elements in Examples. This is presumably because during the formation of the luminescent layer, part of the anode buffer layer dissolved in the toluene solution of the material for the luminescent layer. This is supported by the value of the decrease rate.

Comparative Example 2

The same operation was carried out as in Example 1-(a), except that pHMTPD was replaced with pHMTPD-3 produced in Synthesis Example 6, thereby preparing a composition for an anode buffer layer 6 and producing an organic EL element (hereinafter, also referred to as an "organic EL element 7"). The total thickness of the anode buffer layer and the luminescent layer of the organic EL element 7, and the luminous efficiency thereof and the like are shown in Table 1.

In the organic EL element 7, the total thickness of the anode buffer layer and the luminescent layer was thinner than that in any of the organic EL elements in Examples. This is presumably because during the formation of the luminescent layer, part of the anode buffer layer dissolved in the toluene solution of the material for the luminescent layer. This is supported by the value of the decrease rate.

Comparative Example 3

The same operation was carried out as in Example 1-(a), except that the a glass substrate with an ITO film was coated with the composition for an anode buffer layer 1 by spin coating method (conditions: 3,000 rpm, 30 seconds), and the resulting coating film was allowed to stand under nitrogen atmosphere at room temperature for 1 hour thereby forming an anode buffer layer. Thereby, an organic EL element (hereinafter, also referred to as an "organic EL element 8") was produced. The total thickness of the anode buffer layer and the luminescent layer of the organic EL element 8, and the luminous efficiency thereof and the like are shown in Table 1.

In the organic EL element 8, the decrease rate of the thickness of the anode buffer layer was larger than the decrease rates in the organic EL element 1 and the organic EL element 5 using pHMTPD. Comparison between these organic EL elements reveals that for the insolubilization of the anode buffer layer, not just using the specific material but also heating during the formation of the anode buffer layer are important.

Example 4-(a)

The high-molecular weight compound for an anode buffer layer 1 produced in Synthesis Example 7 and toluene were mixed to prepare a composition for an anode buffer layer (a toluene solution having a solid component concentration of 0.8% by mass, hereinafter also referred to as a "composition for an anode buffer layer 7").

The same operation was carried out as in Example 1-(a), except that the composition for an anode buffer layer 1 was replaced with the composition for an anode buffer layer 7, thereby producing an organic EL element (hereinafter, also referred to as an "organic EL element 9"). The total thickness of the anode buffer layer and the luminescent layer of the organic EL element 9, and the luminous efficiency thereof and the like are shown in Table 1.

Example 4-(b)

The same operation was carried out as in Example 4-(a), except that the high-molecular weight compound for an anode buffer layer 1 was replaced with the high-molecular weight compound for an anode buffer layer 2, thereby preparing a composition for an anode buffer layer 8, and producing an organic EL element (hereinafter, also referred to as an "organic EL element 10"). The total thickness of the anode buffer layer and the luminescent layer of the organic EL element 10, and the luminous efficiency thereof and the like are shown in Table 1.

Example 4-(c)

The same operation was carried out as in Example 4-(a), except that the high-molecular weight compound for an anode buffer layer 1 was replaced with the high-molecular weight compound for an anode buffer layer 3, thereby preparing a composition for an anode buffer layer 9, and producing an organic EL element (hereinafter, also referred to as an "organic EL element 11"). The total thickness of the anode buffer layer and the luminescent layer of the organic EL element 11, and the luminous efficiency thereof and the like are shown in Table 1.

Example 5-(a)

Preparation of Coating Solution for Forming Luminescent Layer

The following phosphorescent high-molecular weight compound (E-4) was synthesized in accordance with the method as described in WO2010/16512. In the high-molecular weight compound (E-4), the weight average molecular weight was 52,000, and the molar ratio between individual repeating units was k:m:n=6:42:52.

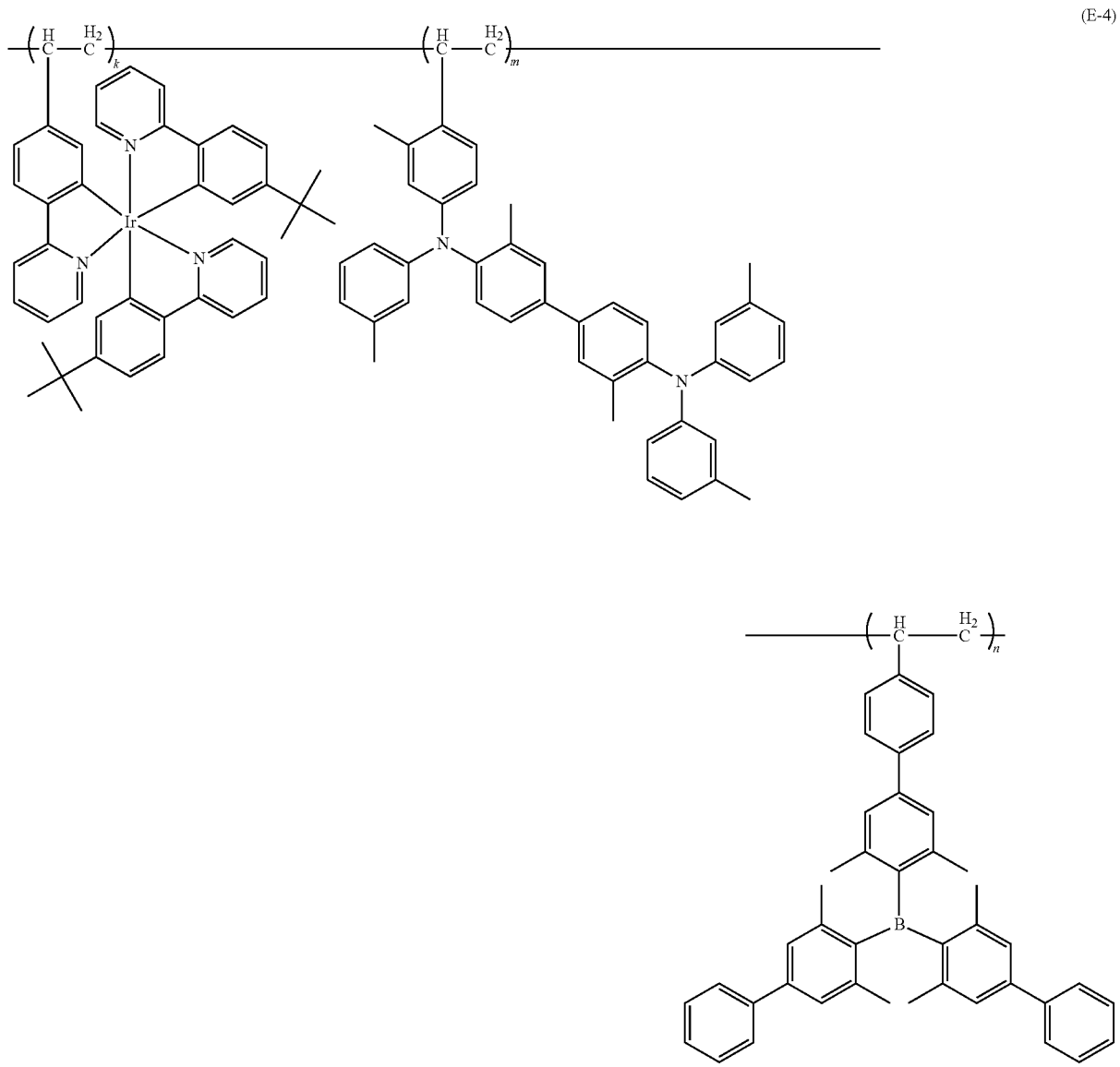

(E-4)

3 parts by weight of this phosphorescent high-molecular weight compound (E-4) was dissolved in 97 parts by weight of xylene to prepare a coating solution for forming a luminescent layer (hereinafter, also referred to as a "coating solution for luminescent layer 2).

<Production of Organic EL Element> pMPDA produced in Synthesis Example 10 (100 parts by mass), which is a high-molecular weight compound for a host, TCNQ (5 parts by mass), which is an electron-accepting compound, and xylene were mixed, thereby preparing a composition for an anode buffer layer (a xylene solution having a solid component concentration of 1.0% by mass). This was applied on a glass substrate with an ITO film by spin coating method (conditions: 3,000 rpm, 30 seconds).

The resulting coating film was allowed to stand under nitrogen atmosphere at 170° C. for 1 hour, thereby forming an anode buffer layer.

The substrate with the anode buffer layer was allowed to sufficiently cool at room temperature. Then, a surface at the anode buffer layer side was coated with the above coating solution for luminescent layer 2 by spin coating method (conditions: 3,000 rpm, 30 seconds). Then, the resulting coating film was allowed to stand under nitrogen atmosphere at 140° C. for 1 hour, thereby forming a luminescent layer. Using a vacuum deposition apparatus, on a surface of the luminescent layer, a LiF layer with a thickness of 0.5 nm serving as a cathode buffer layer was formed, and subsequently, an Al layer with a thickness of 150 nm serving as a cathode was formed. Thereby, an organic EL element (hereafter, also referred to as an "organic EL element 12") was produced.

The luminous efficiency, the driving voltage, the electrical power efficiency and the luminous life were measured in the same manner as in Example 1-(a). They are shown in Table 2.

Example 5-(b) to (d)

The same operations were carried out as in Example 5-(a), except that pMPDA was replaced with pMPDAA, pMPDAB and pDBDMPD produced in Synthesis Examples 11 to 13, respectively, thereby producing organic EL elements (hereinafter, also referred to as an "organic EL element 13", an "organic EL element 14" and an "organic EL element 15", respectively).

The luminous efficiency, the driving voltage, the electrical power efficiency and the luminous life were measured in the same manner as in Example 1-(a). They are shown in Table 2.

Comparative Example 4-(a) to (c)

In accordance with the method as described in Patent documents 1 to 3, compounds R1, R2 and R3 each represented by the following formula were synthesized. The same operations were carried out in Example 5-(a) except that pMPDA was replaced with these compounds, thereby producing organic EL elements (hereinafter, also referred to as an "organic EL element 16", an "organic EL element 17" and an "organic EL element 18", respectively).

The luminous efficiency, the driving voltage, the electrical power efficiency and the luminous life were measured in the same manner as in Example 1-(a). They are shown in Table 2.

Example 6

The same operation was carried out as in Example 1-(c) to form an anode buffer layer on a glass substrate with an ITO film. Then, using a vacuum deposition apparatus, the following compounds (E-5) and (E-6) were co-deposited at a mass ratio of 9:1, thereby forming a luminescent layer with a thickness of 30 nm. Subsequently, a layer of a compound (E-7) with a thickness of 20 nm serving as an electron injection layer was formed. Furthermore, a LiF layer and an Al layer were formed in the same manner as in Example 1-(c). Thereby, an organic EL element (hereinafter, also referred to as an "organic EL element 19") was produced.

The luminous efficiency, the driving voltage, the electrical power efficiency and the luminous life were measured in the same manner as in Example 1-(a). They are shown in Table 2.

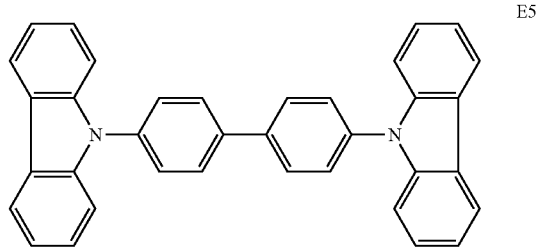

E5

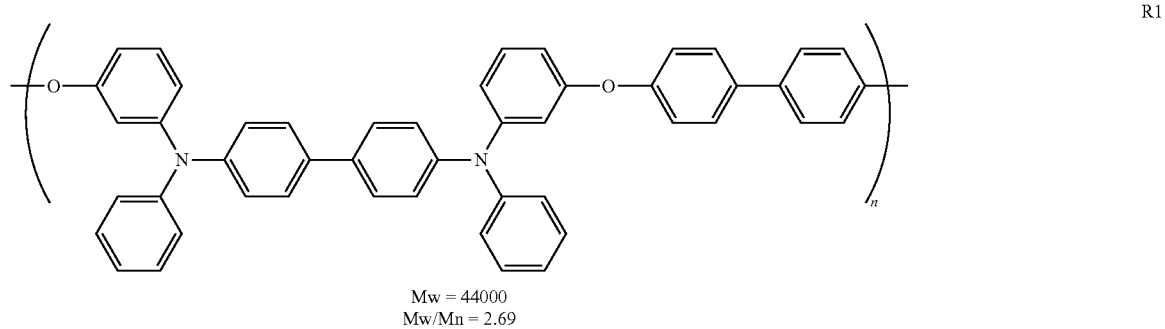

R1

Mw = 44000
Mw/Mn = 2.69

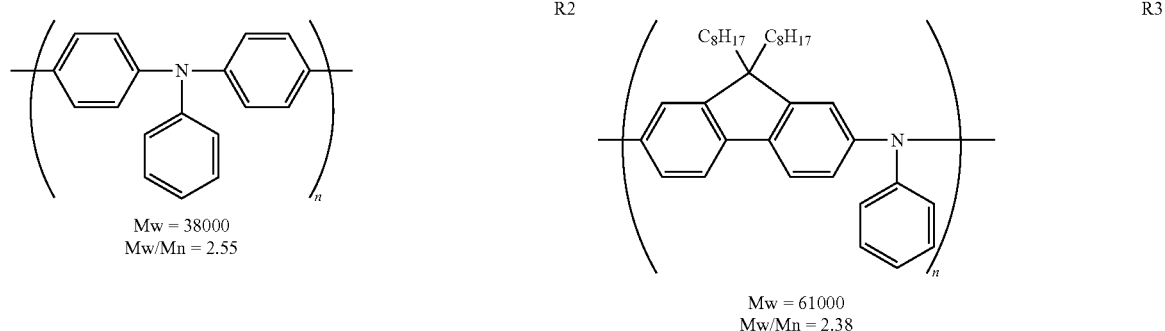

R2

Mw = 38000
Mw/Mn = 2.55

R3

Mw = 61000
Mw/Mn = 2.38

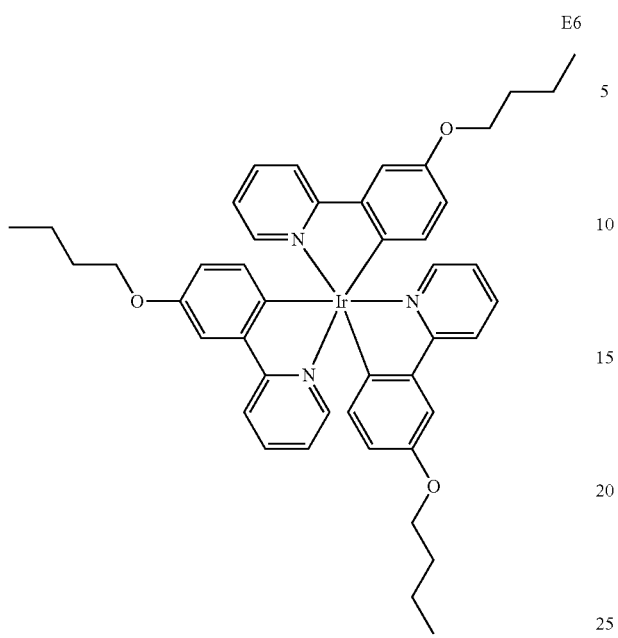

E6

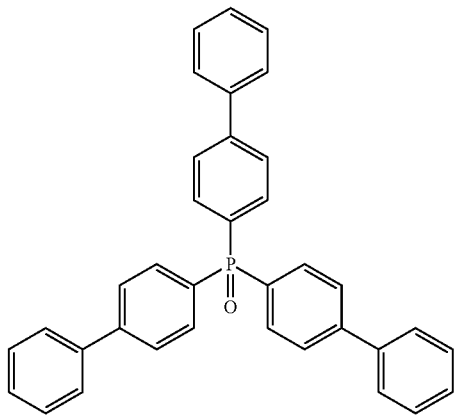

E7

Comparative Example 5

The same operation was carried out as in Example 6, except that pTmTDMPD was replaced with the compound R1, thereby producing an organic EL element (hereinafter, also referred to as an "organic EL element 20").

The luminous efficiency, the driving voltage, the electrical power efficiency and the luminous life were measured in the same manner as in Example 1-(a). They are shown in Table 2.

TABLE 1

| | | Total thickness of organic layers of organic EL element | Luminous efficiency (%) | Driving voltage (V @100 cd/m$^2$) | Electrical power efficiency (1 m/W) | Luminous life (hour) | Thickness of anode buffer layer before dissolution test treatment (nm) | Thickness of anode buffer layer after dissolution test treatment (nm) | Decrease rate of thickness of anode buffer layer (%) |
|---|---|---|---|---|---|---|---|---|---|
| Ex. 1-(a) | Organic EL element 1 pHMTPD Mw = 68,000 | 69 | 10.7 | 3.7 | 31.9 | 3000 | 21 | 20 | 4.8 |
| Ex. 1-(b) | Organic EL element 2 pHMTPD-2 Mw = 22,000 | 68 | 9.5 | 3.9 | 25.0 | 2500 | 20 | 18 | 10 |
| Ex. 1-(c) | Organic EL element 3 pTmTDMPD Mw = 110,000 | 70 | 11.1 | 3.5 | 34.9 | 3400 | 21 | 21 | 0 |
| Ex. 2 | Organic EL element 4 pHMTPD-TPD Mw = 100,000 | 69 | 10.8 | 3.6 | 33.7 | 3300 | 20 | 20 | 0 |
| Ex. 3 | Organic EL element 5 pHMTPD Mw = 68,000 heating temperature (80° C., 1 h) | 65 | 8 | 4.0 | 22.9 | 2400 | 20 | 15 | 25 |
| Com. Ex. 1 | Organic EL element 6 pTPD Mw = 64,000 | 54 | 1.3 | 5.6 | 2.0 | 20 | 18 | 2 | 89 |
| Com. Ex. 2 | Organic EL element 7 pHMTPD-3 Mw = 10,000 | 52 | 1.7 | 6.0 | 3.1 | 25 | 20 | 1 | 95 |
| Com. Ex. 3 | Organic EL element 8 pHMTPD Mw = 68,000 room temperature, 1 h | 59 | 4.7 | 5.1 | 9.9 | 800 | 20 | 7 | 65 |
| Ex. 4-(a) | Organic EL element 9 pHMTPD-pPhTCNQ Mw = 69,000 | 70 | 11.0 | 3.6 | 31.8 | 4000 | 19 | 19 | 0 |
| Ex. 4-(b) | Organic EL element 10 pHMTPD-pPhF3TCNQ Mw = 67,000 | 68 | 10.3 | 3.8 | 31.7 | 4900 | 22 | 21 | 4.5 |

TABLE 1-continued

| | | Total thickness of organic layers of organic EL element | Luminous efficiency (%) | Driving voltage (V @100 cd/m²) | Electrical power efficiency (1 m/W) | Luminous life (hour) | Thickness of anode buffer layer before dissolution test treatment (nm) | Thickness of anode buffer layer after dissolution test treatment (nm) | Decrease rate of thickness of anode buffer layer (%) |
|---|---|---|---|---|---|---|---|---|---|
| Ex. 4-(c) | Organic EL element 11 pHMTPD-pPhDCNQI Mw = 66,000 | 69 | 10.5 | 3.7 | 31.6 | 4200 | 21 | 20 | 4.8 |

TABLE 2

| | | Total thickness of organic layers of organic EL element | Luminous efficiency (%) | Driving voltage (V @100 cd/m²) | Electrical power efficiency (1 m/W) | Luminous life (hour) | Thickness of anode buffer layer before dissolution test treatment (nm) | Thickness of anode buffer layer after dissolution test treatment (nm) | Decrease rate of thickness of anode buffer layer (%) |
|---|---|---|---|---|---|---|---|---|---|
| Ex. 5-(a) | Organic EL element 12 pMPDA Mw = 95,000 | 72 | 9.3 | 3.7 | 29.5 | 2200 | 25 | 25 | 0 |
| Ex. 5-(b) | Organic EL element 13 pMPDAA Mw = 67,000 | 71 | 8.9 | 3.9 | 26.0 | 1900 | 25 | 22 | 12 |
| Ex. 5-(c) | Organic EL element 14 pMPDAB Mw = 95,000 | 70 | 9.0 | 4.0 | 26.8 | 1700 | 26 | 22 | 15 |
| Ex. 5-(d) | Organic EL element 15 pDBDMPD Mw = 170,000 | 66 | 10.0 | 3.6 | 30.4 | 2400 | 24 | 20 | 17 |
| Com. Ex. 4-(a) | Organic EL element 16 R1 Mw = 44,000 | 58 | 2.1 | 4.6 | 7.8 | 250 | 26 | 10 | 62 |
| Com. Ex. 4-(b) | Organic EL element 17 R2 Mw = 38,000 | 50 | 1.5 | 5.3 | 2.5 | 15 | 25 | 11 | 56 |
| Com. Ex. 4-(c) | Organic EL element 18 R3 Mw = 61,000 | 49 | 1.9 | 5.1 | 3.1 | 20 | 28 | 3 | 89 |
| Ex. 6 | Organic EL element 19 pTmTDMPD Mw = 110,000 | 75 | 8.4 | 4.4 | 37.9 | 5500 | | | |
| Com. Ex. 5 | Organic EL element 20 R1 Mw = 44,000 | 75 | 8.0 | 4.7 | 32.6 | 1600 | | | |

DESCRIPTION OF MARKS

1 . . . substrate
2 . . . anode
3 . . . anode buffer layer
4 . . . luminescent layer
5 . . . cathode

The invention claimed is:

1. A composition for an anode buffer layer comprising:
an electron-accepting compound;
a high-molecular weight compound having a structural unit represented by the following formula (1) or the following formula (2) and having a weight average molecular weight of 20,000 to 1,000,000 as measured by GPC:

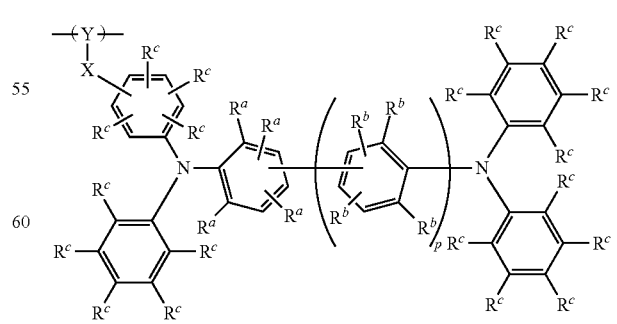

(1)

-continued

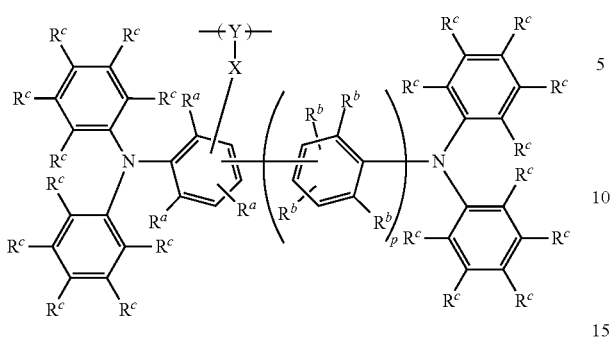
(2)

wherein in each of the formulae (1) and (2);
plural $R^a$s are each independently a hydrogen atom or an alkyl group having 1 to 10 carbon atoms, with at least one $R^a$ being the alkyl group having 1 to 10 carbon atoms, and
in a benzene ring having $R^a$ in the formulae (1) and (2), at least one $R^a$ present at an ortho position with respect to a nitrogen atom is an alkyl group;
plural $R^b$s are each independently a hydrogen atom or an alkyl group having 1 to 10 carbon atoms;
plural $R^c$s are each independently a hydrogen atom, a halogen atom, a cyano group, an amino group, an alkyl group having 1 to 10 carbon atoms, or an alkoxy group having 1 to 10 carbon atoms, $R^c$s each bonded to neighboring carbon atoms in the same phenyl group may be bonded to one another to form a condensed ring, and at least one of $R^c$s in the same phenyl group is an alkyl group having 1 to 10 carbon atoms;
X is a single bond, —O—, —S—, —SO—, —SO$_2$—, —NR$^1$— wherein R$^1$ is a hydrogen atom, an alkyl group having 1 to 4 carbon atoms, or a phenyl group, —CO—, —COO—, or a divalent organic group having 1 to 20 carbon atoms, wherein the organic group may contain an atom or a group selected from the group consisting of —O—, —S—, —SO—, —SO$_2$—, —NR$^2$— wherein R$^2$ is a hydrogen atom, an alkyl group having 1 to 4 carbon atoms, or a phenyl group, —CO— and —COO—;
Y—X— is a group represented by:

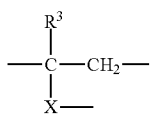

wherein R$^3$ is a hydrogen atom or an alkyl group having 1 to 4 carbon atoms; and p is 0, 1, or 2; and
an organic solvent, the organic solvent being an aromatic solvent comprising toluene, xylene, and/or anisole or a halogenated alkyl solvent comprising chloroform and/or dichloroethane, or a combination thereof.

2. A high-molecular weight compound for an anode buffer layer comprising:
a structural unit represented by the following formula (1) or the following formula (2), and
a structural unit derived from an electron-accepting compound having a polymerizable functional group, the polymerizable functional group being represented by at least one of the following formulae (A1) to (A13), the said high-molecular weight compound for an anode buffer layer having a weight average molecular weight of 20,000 to 1,000,000 as measured by GPC:

(A1)

(A2)

(A3)

(A4)

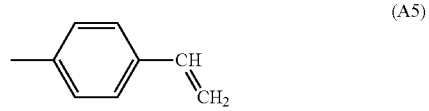
(A5)

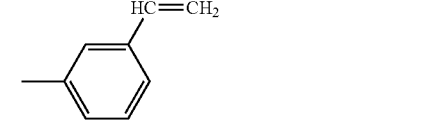
(A6)

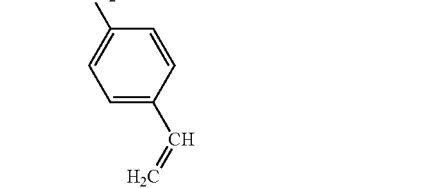
(A7)

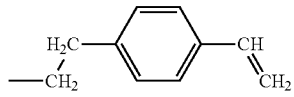
(A8)

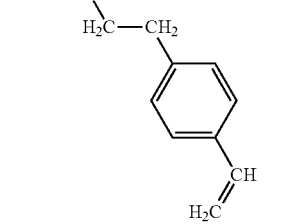
(A9)

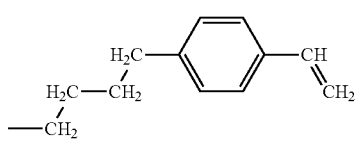
(A10)

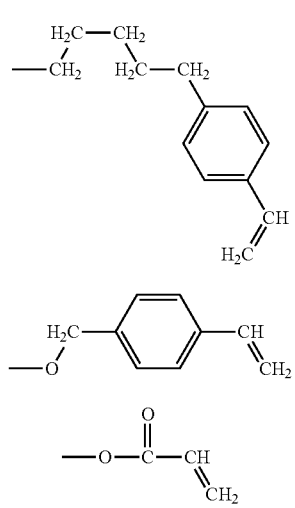

(A11)

(A12)

(A13)

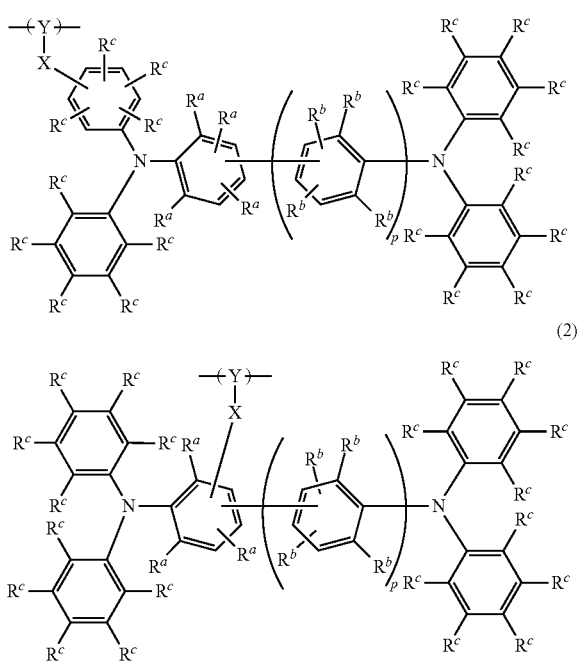

(1)

(2)

wherein in each of the formulae (1) and (2);
plural $R^a$s are each independently a hydrogen atom or an alkyl group having 1 to 10 carbon atoms, with at least one $R^a$ being the alkyl group having 1 to 10 carbon atoms;

plural $R^b$s are each independently a hydrogen atom or an alkyl group having 1 to 10 carbon atoms;

plural $R^c$s are each independently a hydrogen atom, a halogen atom, a cyano group, an amino group, an alkyl group having 1 to 10 carbon atoms, or an alkoxy group having 1 to 10 carbon atoms, and $R^c$s each bonded to neighboring carbon atoms in the same phenyl group may be bonded to one another to form a condensed ring;

X is a single bond, —O—, —S—, —SO—, —SO$_2$—, —NR$^1$— wherein R$^1$ is a hydrogen atom, an alkyl group having 1 to 4 carbon atoms, or a phenyl group, —CO—, —COO—, or a divalent organic group having 1 to 20 carbon atoms, wherein the organic group may contain an atom or a group selected from the group consisting of —O—, —S—, —SO—, —SO$_2$—, —NR$^2$— wherein R$^2$ is a hydrogen atom, an alkyl group having 1 to 4 carbon atoms, or a phenyl group, —CO— and —COO—;

Y—X— is a group represented by:

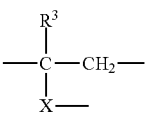

wherein R$^3$ is a hydrogen atom or an alkyl group having 1 to 4 carbon atoms; and p is 0, 1, or 2.

3. A composition for an anode buffer layer comprising the high-molecular weight compound for an anode buffer layer of claim 2 and an organic solvent.

4. An organic electroluminescence element comprising an anode, an anode buffer layer, a luminescent layer and a cathode that are laminated in this order, wherein the anode buffer layer is formed by heating the composition for an anode buffer layer of claim 1.

5. The organic electroluminescence element according to claim 4, further comprising a cathode buffer layer.

6. A display apparatus comprising the electroluminescence element of claim 4.

7. A light irradiating apparatus comprising the electroluminescence element of claim 4.

8. An organic electroluminescence element comprising an anode, an anode buffer layer, a luminescent layer and a cathode that are laminated in this order, wherein the anode buffer layer is formed by heating the high-molecular weight compound for an anode buffer layer of claim 2.

9. The organic electroluminescence element according to claim 8, further comprising a cathode buffer layer.

10. A display apparatus comprising the electroluminescence element of claim 8.

11. A light irradiating apparatus comprising the electroluminescence element of claim 8.

* * * * *